(12) United States Patent
Ishida et al.

(10) Patent No.: US 11,411,156 B2
(45) Date of Patent: Aug. 9, 2022

(54) HEAT EXCHANGE DEVICE, HEAT EXCHANGE SYSTEM, AND HEAT EXCHANGE METHOD

(71) Applicant: NEC CORPORATION, Tokyo (JP)

(72) Inventors: Masahiko Ishida, Tokyo (JP); Akihiro Kirihara, Tokyo (JP); Yuma Iwasaki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 398 days.

(21) Appl. No.: 16/495,591

(22) PCT Filed: Mar. 13, 2018

(86) PCT No.: PCT/JP2018/009714
§ 371 (c)(1),
(2) Date: Sep. 19, 2019

(87) PCT Pub. No.: WO2018/173853
PCT Pub. Date: Sep. 27, 2018

(65) Prior Publication Data
US 2020/0020842 A1    Jan. 16, 2020

(30) Foreign Application Priority Data

Mar. 21, 2017  (JP) .............................. JP2017-054446

(51) Int. Cl.
*H01L 35/30* (2006.01)
*H01L 37/00* (2006.01)
(Continued)

(52) U.S. Cl.
CPC .............. *H01L 35/30* (2013.01); *F25B 21/02* (2013.01); *H01L 37/00* (2013.01); *F25B 2321/0252* (2013.01); *H01L 43/02* (2013.01)

(58) Field of Classification Search
CPC ......... H01L 35/30; H01L 37/00; H01L 37/04; H01L 43/02; F25B 21/02; F25B 2321/0252; Y02E 60/14; F28D 1/05366; F28D 20/00
See application file for complete search history.

(56) References Cited

U.S. PATENT DOCUMENTS

| | | | |
|---|---|---|---|
| 2014/0230873 A1* | 8/2014 | Kirihara | .................. H01L 37/04 136/205 |
| 2015/0303363 A1* | 10/2015 | Kirihara | .................. H01L 37/04 136/201 |
| 2017/0213639 A1* | 7/2017 | Kudo | .................. H01F 27/2804 |

FOREIGN PATENT DOCUMENTS

| | | |
|---|---|---|
| JP | 60-74656 A | 4/1985 |
| JP | 62-87156 U | 6/1987 |

(Continued)

OTHER PUBLICATIONS

Arne Brataas, Inulating Magnets Control Neighbor'S Conduction, May 2013, Physics 6, 56; URL:http://link.aps.org/doi/10.1103/Physics.6.56 (Year: 2013).*

(Continued)

*Primary Examiner* — Emmanuel E Duke
(74) *Attorney, Agent, or Firm* — Sughrue Mion, PLLC

(57) ABSTRACT

[Problem] To provide a heat exchange device with which efficient electric power generation can be performed while transfer of a heat amount is maintained. [Solution] A heat exchange device comprising a heat exchange section 1 and a magnetic body 2. The heat exchange section 1 includes a first heat transmission interface 3 in contact with a heat source, and a second heat transmission interface 4 in contact with a heat bath having a temperature different from that of the heat source. The magnetic body 2 is interposed between the first heat transmission interface 3 and the second heat transmission interface 4 of the heat exchange section 1, and (Continued)

includes a magnetization component in a direction intersecting a heat flux produced between the first heat transmission interface 3 and the second heat transmission interface 4.

17 Claims, 12 Drawing Sheets

(51) Int. Cl.
*F25B 21/02* (2006.01)
*H01L 43/02* (2006.01)

(56) References Cited

FOREIGN PATENT DOCUMENTS

| JP | 7-142769 A | 6/1995 |
|---|---|---|
| JP | 11-340523 A | 12/1999 |
| JP | 2005-295725 A | 10/2005 |
| JP | 2014-072256 A | 4/2014 |
| JP | 2015-219464 A | 12/2015 |
| JP | 2016-009838 A | 1/2016 |
| JP | 2016-103535 A | 6/2016 |
| WO | 2012/169377 A1 | 12/2012 |

OTHER PUBLICATIONS

K. Uchida et al. "Spin Seebeck insulator", Nature Materials, Nov. 2010, pp. 894-897, vol. 9.

Yuya Sakuraba, "Potential of thermoelectric power generation using anomalous Nernst effect in magnetic materials, Scripta Materialia, 2016, pp. 29-32, vol. 111, <DOI:10.1016/j.scriptamat.2015.04.034>".

Muhammad Ikhlas et al., "Large anomalous Nernst eect at room temperature in a chiral antiferromagnet", Nature Physics, Jul. 24, 2017, pp. 1085-1090, vol. 13, <DOI:10.1038/NPHYS4181>.

International Search Report for PCT/JP2018/009714 dated May 15, 2018 [PCT/ISA/210].

Written Opinion for PCT/JP2018/009714 dated May 15, 2018 [PCT/ISA/237].

* cited by examiner

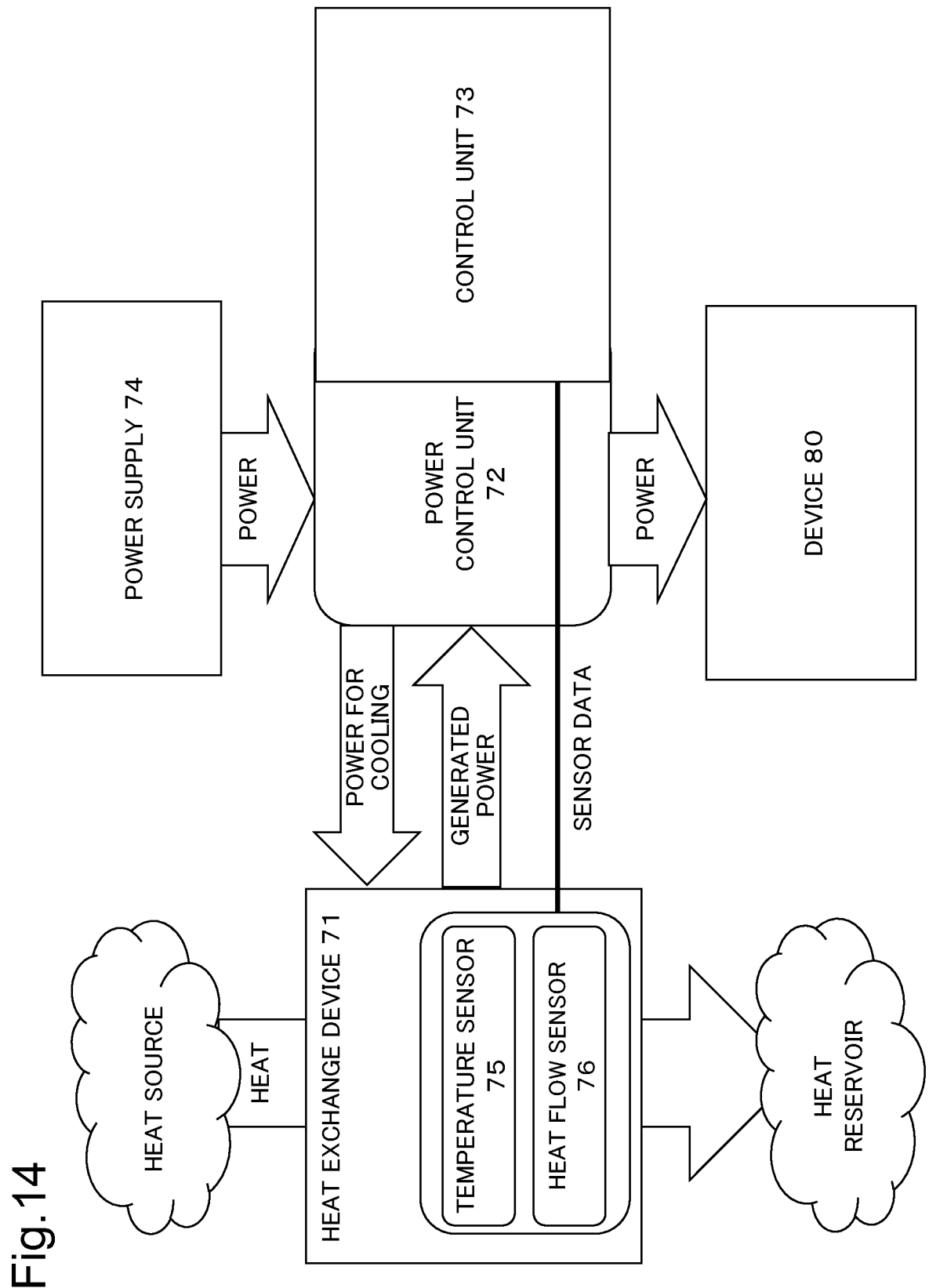

HEAT EXCHANGE DEVICE, HEAT EXCHANGE SYSTEM, AND HEAT EXCHANGE METHOD

CROSS REFERENCE TO RELATED APPLICATIONS

This application is a National Stage of International Application No. PCT/JP2018/009714 filed Mar. 13, 2018, claiming priority based on Japanese Patent Application No. 2017-054446 filed on Mar. 21, 2017, the entire contents of which are incorporated by reference.

TECHNICAL FIELD

The present invention relates to a heat exchange device, and more particularly to a technique for generating electricity by thermoelectric conversion at the time of heat exchange.

BACKGROUND ART

There is a system intended for the purpose of transfer of a quantity of heat from a high-temperature heat source to a low-temperature heat reservoir, that is, performing heat exchange with a certain magnitude or more. For example, an internal combustion engine used for an automobile, a generator, and the like consumes energy in order to acquire motive power and electric power, and a considerable proportion of the consumed amount is ultimately converted to heat. When heat continues to be generated, an internal temperature of the internal combustion engine rises, which may cause an equipment failure, and therefore, it is necessary to discharge unnecessary heat for the purpose of equipment maintenance.

Therefore, a device or the like having an internal combustion engine is equipped with a heat exchange device called air-cooled fin, radiator, and the like, and exhausts heat in such a way that the device is not heated to a certain temperature or higher. A configuration of these heat exchange devices is determined according to conditions such as a heat generation amount generated within a fixed time in the internal combustion engine, an ambient temperature that becomes the heat reservoir, and the maximum allowable temperature. One of important performance indicators for a heat exchange device is thermal resistivity, and the heat exchange device is designed in such a way as to reduce thermal resistivity to a certain level or below. In other words, the heat exchange device is designed in such a way that a heat transfer coefficient, which is the reciprocal of the thermal resistivity, is equal to or greater than a certain value.

One of forms of utilization of waste heat is an attempt to convert the waste heat into electricity. In a large vessel or the like, there are cases where secondary waste heat power generation using a Stirling engine is performed by using high temperature waste heat of an internal combustion engine. However, power generation using a prime mover is extremely decreased in efficiency when a temperature of a heat source decreases or a scale of power generation decreases, and therefore, cases that can be used for waste heat power generation are limited.

An attempt has been made to use a thermoelectric conversion element for power generation using waste heat. A thermoelectric conversion element applies a heat flow to an element made of solid state material, converts a part of the heat into an electric current, and extracts the electric current. Even when a temperature of the heat source decreases or a scale of power generation decreases, the efficiency does not decrease extremely, and therefore, there is an advantage in that even relatively low-temperature small-scale waste heat can be used for power generation.

In order to acquire larger power by using the thermoelectric conversion element, two points are important requirements, which are increasing conversion efficiency of the thermoelectric conversion element itself and increasing an amount of heat input to the element, with assuming certain conditions such as a temperature of the heat source, an environmental temperature, a size of the system. For example, when a thermoelectric conversion element and a heat exchange device are used in combination, a larger amount of power can be generated since an amount of heat flow input to the element is increased as compared with a case where the heat exchange device is not used.

For example, a technique such as PTL 1 is disclosed as a technique for performing efficient heat dissipation. A heat exchange device of PTL 1 contains a refrigerant inside a sealed radiator with fins for heat dissipation, and cools electronic components around the heat exchange device by heat of vaporization of the refrigerant.

Further, as a technique for generating electricity by attaching a thermoelectric conversion element to a heat exchange device, for example, a technique such as PTL 2 is disclosed. A heat exchange device of PTL 2 generates electricity by attaching a thermoelectric conversion element to an outer surface of a heat dissipation tube through which water carrying heat flows.

Furthermore, as a technique related to a thermoelectric conversion element used when generating power, a technique such as PTL 3 is disclosed. PTL 3 generates electricity by using a thermoelectric conversion element of bismuth telluride.

Further, as a technique for improving power generation efficiency in a thermoelectric conversion element, for example, techniques such as PTLs 4 and 5 and NTL 1 are disclosed. In PTL 4 and 5, and NTL 1, power generation is performed by a thermoelectric conversion element using a magnetic material having a spin Seebeck effect or the like.

CITATION LIST

Patent Literature

[PTL 1] Japanese Unexamined Patent Application Publication No. S60-74656
[PTL 2] Japanese Utility Model Application Publication No. S62-87156
[PTL 3] Japanese Unexamined Patent Application Publication No. H11-340523
[PTL 4] International Publication No. WO2012/169377
[PTL 5] Japanese Unexamined Patent Application Publication No. 2016-9838

Non Patent Literature

[NPL 1] Uchida et al., "Spin Seebeck insulator", Nature Materials, 2010, vol.9, pp.894-897

SUMMARY OF INVENTION

Technical Problem

However, the techniques described in the prior art documents are not sufficient in the following points. A contradiction may occur between performing heat amount transfer from the heat source to the heat reservoir, which is the original purpose of the heat exchange device, with a certain magnitude or larger, and attaching the thermoelectric conversion element for power generation to the heat exchange device. For example, when thermoelectric conversion elements of PTLs 2 to 5 and NTL 1 are attached to the heat exchange device of PTL 1, heat transferability of the heat exchange device is greatly reduced. In other words, even when a heat exchange device having a large heat transfer coefficient, i.e., a small thermal resistance, is used, when the thermal resistance of the thermoelectric conversion element used in series with the heat exchange device in the heat transfer system is large, the thermoelectric conversion element part inhibits heat transfer, and transfer of a heat amount is reduced. Therefore, in the configuration where the thermoelectric conversion element is attached to the heat exchange device, it is difficult to simultaneously satisfy power generation by thermoelectric conversion and discharge of heat by the heat exchange device. Therefore, the technique described in each prior art document is not sufficient as a technique for performing efficient power generation while maintaining transfer of a heat amount in the heat exchange device.

An object of the present invention is to provide a heat exchange device capable of efficiently generating power while maintaining heat transferability in order to solve the above-mentioned problems.

Solution to Problem

In order to solve the above-mentioned problems, a heat exchange device according to an example aspect of the invention includes a heat exchange section and a magnetic body. The heat exchange section includes a first heat transfer interface in contact with a heat source and a second heat transfer interface in contact with a heat reservoir having a temperature different from the heat source. The magnetic body is sandwiched between the first heat transfer interface and the second heat transfer interface of the heat exchange section and includes a magnetization component in a direction intersecting a heat flux generated between the first heat transfer interface and the second heat transfer interface.

A heat exchange method according to an example aspect of the invention includes sandwiching, between a first heat transfer interface in contact with a heat source and a second heat transfer interface in contact with a heat reservoir having a temperature different from the heat source, a magnetic body having a magnetization component in a direction intersecting a heat flux generated between the first heat transfer interface and the second heat transfer interface. The heat exchange method according to the present invention includes causing a first fluid being sent from the heat source or the heat source to be in contact with the first heat transfer interface, and causing a second fluid being sent from the heat reservoir or the heat reservoir to be in contact with the second heat transfer interface. The heat exchange method according to the present invention includes outputting power generated by thermoelectromotive force in the magnetic body to outside.

Advantageous Effects of Invention

According to the present invention, power generation can be efficiently performed while maintaining heat transferability.

BRIEF DESCRIPTION OF DRAWINGS

FIG. 14 is a figure illustrating overview of a configuration of a sixth example embodiment of the present invention.

EXAMPLE EMBODIMENT

First Example Embodiment

Figure 1:
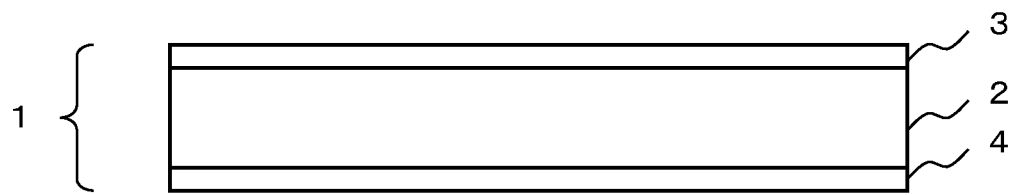
FIG. 1 is a figure illustrating overview of a configuration of a first example embodiment of the present invention.

The first example embodiment of the present invention will be described in detail with reference to the drawings. FIG. 1 illustrates overview of a configuration of a heat exchange device according to the first example embodiment. The heat exchange device of the present example embodiment includes a heat exchange section 1 and a magnetic body 2. The heat exchange section 1 includes a first heat transfer interface 3 in contact with a heat source and a second heat transfer interface 4 in contact with a heat reservoir having a temperature different from that of the heat source. The magnetic body 2 is sandwiched between the first heat transfer interface 3 and the second heat transfer interface 4 of the heat exchange section 1, and has a magnetization component in the direction intersecting the heat flux generated between the first heat transfer interface 3 and the second heat transfer interface 4.

The heat exchange device of the present example embodiment includes a magnetic body having a magnetization component in the direction intersecting the heat flux generated between the two interfaces, between the first heat transfer interface 3 and the second heat transfer interface 4 of the heat exchange section 1. Therefore, a thermal gradient between the heat source and the heat reservoir generates a thermoelectromotive force in the magnetic body 2 when the heat flux generated between the two interfaces is generated. Since the heat exchange device of the present example embodiment generates electric power by thermoelectromotive force in the heat exchange section 1, it is possible to suppress an increase in the thermal resistance because it is not necessary to further attach a thermoelectric conversion element or the like. In addition, since the heat exchange device of the present example embodiment has the magnetic body 2 in the heat exchange section 1 and a large heat flow can be made to flow into the magnetic body which is a thermoelectric conversion element, it is possible to efficiently generate power. As a result, the heat exchange device of the present example embodiment can generate power efficiently while maintaining the heat transfer property.

Second Example Embodiment

Figure 2:
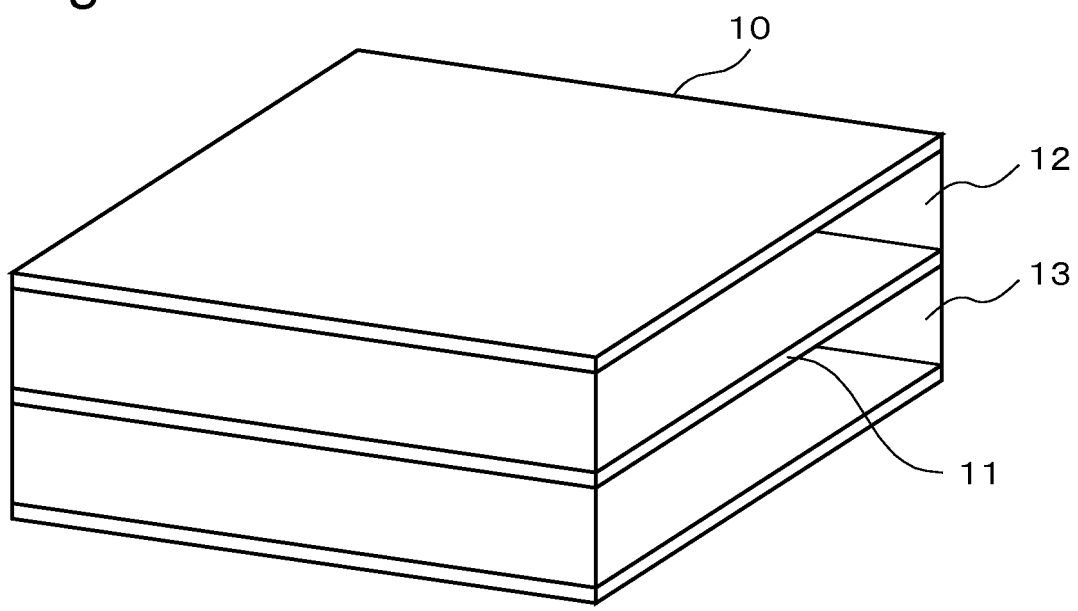
FIG. 2 is a figure illustrating overview of a configuration of a second example embodiment of the present invention.

The second example embodiment of the present invention will be described in detail with reference to the drawings. FIG. 2 is a figure illustrating overview of a configuration of a heat exchange device 10 of the second example embodiment of the present invention. The heat exchange device 10 includes a heat exchange section 11, a first flow path 12, and a second flow path 13. The heat exchange device 10 of the present example embodiment is a flat plate heat exchange device that acquires electric power by the thermoelectromotive force generated by the temperature difference at the heat exchange section 11 provided between the first flow path 12 through which the fluid sent from the heat source flows and the second flow path 13 through which the fluid sent from the heat reservoir flows.

Figure 3A:
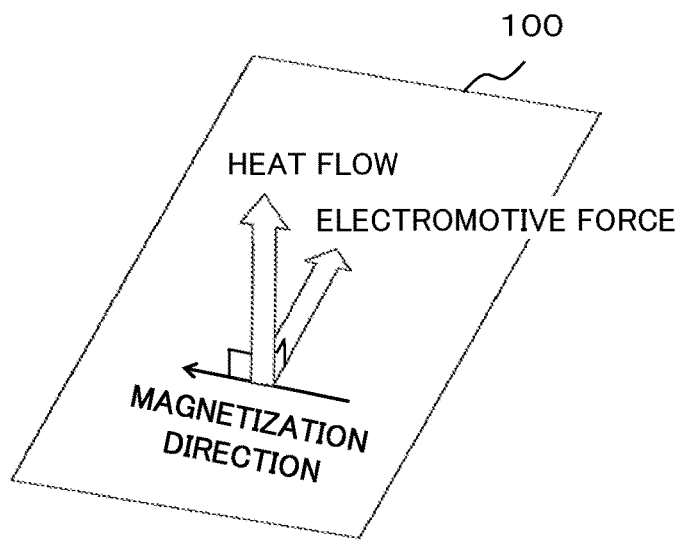
FIG. 3A is a perspective view illustrating a thermoelectric conversion member of a second example embodiment of the present invention.
Figure 3B:
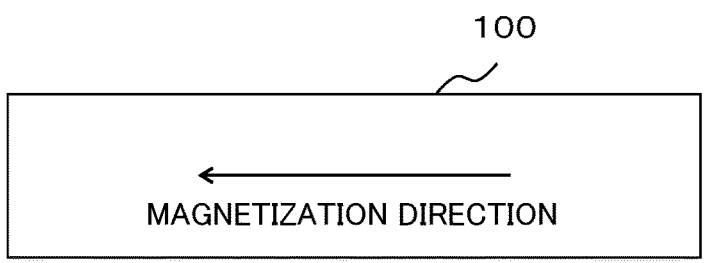
FIG. 3B is a sectional view illustrating the thermoelectric conversion member of the second example embodiment of the present invention.

The heat exchange section 11 is a flat plate thermoelectric conversion member which acquires electric power on the basis of the thermoelectromotive force generated by the temperature difference. The configuration of the thermoelectric conversion member used for the heat exchange section 11 will be described. FIG. 3A and FIG. 3B are figures schematically illustrating an example of the configuration of the thermoelectric conversion member 100. FIG. 3A is a perspective view illustrating overview of the thermoelectric conversion member 100. FIG. 3B is a sectional view of the thermoelectric conversion member 100.

The thermoelectric conversion member 100 is made of a magnetic material a uniform material having magnetism such as ferromagnetism, ferrimagnetism or antiferromagnetism, and electrical conductivity. The thermoelectric conversion member 100 has a flat plate structure. The thermoelectric conversion member 100 is made of, for example, a magnetic transition metal having 3d orbital electrons such as Mn, Fe, Co or Ni, or a magnetic metal alloy containing at least one of the transition metals. The thermoelectric conversion member 100 has a magnetization or magnetic moment component oriented in parallel in the plane of the plate-like structure.

Since the thermoelectric conversion member 100 is disposed between the first flow path 12 and the second flow path 13 as the heat exchange section 11, a heat flow is generated in such a way as to penetrate in the direction perpendicular to the surface by the temperature difference between the fluid flowing through the first flow path 12 and the fluid flowing through the second flow path 13. When a temperature difference is steadily generated on the front surface and the back surface of the flat plate of the thermoelectric conversion member 100, the thermoelectric conversion member 100 generates thermoelectromotive force by an anomalous Nernst effect parallel to the direction perpendicular to both the heat flow direction and the magnetization direction.

The thermoelectromotive force due to the anomalous Nernst effect has a property in which the sign changes depending on the material of which the thermoelectric conversion member 100 is made. Therefore, the direction of the thermoelectromotive force generated in the thermoelectric conversion member 100 may be antiparallel to the direction illustrated in FIG. 3A.

Figure 4:
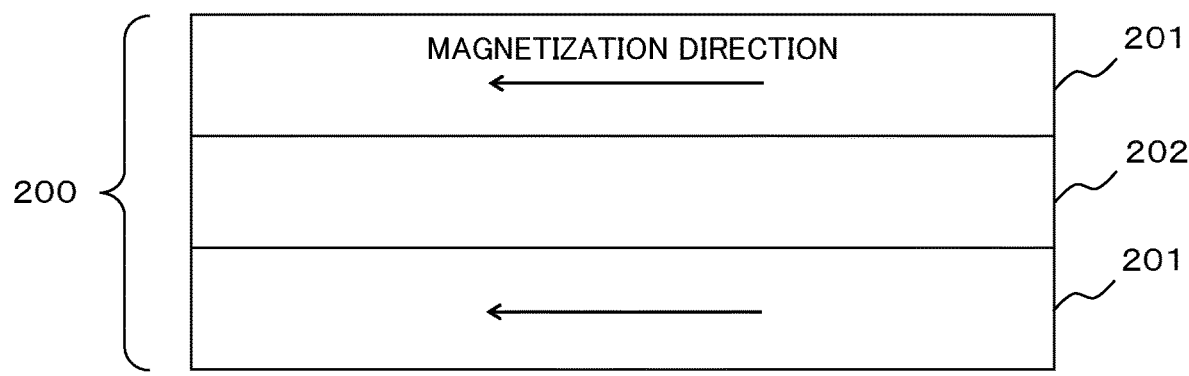
FIG. 4 is a figure illustrating an example of another thermoelectric conversion member of the second example embodiment of the present invention.

Subsequently, an example in which the heat exchange section 11 is made of a thermoelectric conversion member using a composite material will be described. FIG. 4 is a sectional view illustrating a configuration of a thermoelectric conversion member 200 using a composite material.

The thermoelectric conversion member 200 is made of an insulating thermoelectric conversion material 201 and a conductive thermoelectric conversion material 202.

The insulating thermoelectric conversion material 201 can be made, for example, using yttrium iron garnet (YIG: Yttrium Iron Garnet, $Y_3Fe_5O_{12}$)). The insulating thermoelectric conversion material 201 may be made using bismuth (Bi)-doped YIG (Bi: YIG) or ytterbium-doped YIG ($YbY_3Fe_5O_{12}$). Further, as the insulating thermoelectric conversion material 201, a spinel ferrite material made of the composition $MFe_2O_4$ (M is a metal element and contains any of Ni, Zn, or Co) may be used. In addition, materials in which element substitution is performed on magnetite ($Fe_3O_4$) or other oxide magnetic body having a garnet structure or spinel structure may have weak electrical conductivity. An oxide magnetic body material having such weak electrical conductivity can also be used as the insulating thermoelectric conversion material 201.

The conductive thermoelectric conversion material 202 can be made using a conductor that exhibits the inverse spin Hall effect (spin orbit interaction). The conductive thermoelectric conversion material 202 is made using, for example, Au, Pt, Pd, Ni, Fe, Bi, other transition metals having d orbitals or f orbitals, or alloy materials having transition metals having relatively large spin-orbit interaction. The conductive thermoelectric conversion material 202 can also be made using a metal film material in which a similar effect is exhibited by doping a material such as Fe or Ir in about 0.5 to 10 mol percent to a common metal film material such as Cu.

In addition, when using W, Ta, Mo, Cr, V, or Ti among transition metals, it is possible to acquire a voltage of the opposite sign to Au, Pt, Pd, or an alloy containing Au, Pt, or Pd. In other words, when W, Ta, Mo, Cr, V, or Ti is used, the direction of the current generated by the inverse spin Hall effect is opposite to that of Au, Pt, Pd, or an alloy containing Au, Pt, or Pd. In addition, the conductive thermoelectric conversion material 202 may be made using a magnetic oxide semiconductor such as indium tin oxide (ITO) or a magnetic oxide such as a composition $CuMo_2$ or $SrMO_3$ (M is a metal element and contains any one of Mn, Ni, Co, or Fe).

The insulating thermoelectric conversion material 201 and the conductive thermoelectric conversion material 202 are joined via a clean interface. Therefore, the insulating thermoelectric conversion material 201 and the conductive thermoelectric conversion material 202 function as a spin Seebeck element. By functioning as a spin Seebeck element, the material forming the insulating thermoelectric conversion material 201 and the conductive thermoelectric conversion material 202 and its interface can be used as a member constituting the heat exchange section 11 of the heat exchange device 10. Further, in the thermoelectric conversion member 200, two insulating thermoelectric conversion materials 201 are disposed in such a way as to sandwich the conductive thermoelectric conversion material 202. With the utilization in such an arrangement, the insulating thermoelectric conversion material 201 has a function of covering a conductor generating a thermoelectromotive force.

Figure 5:
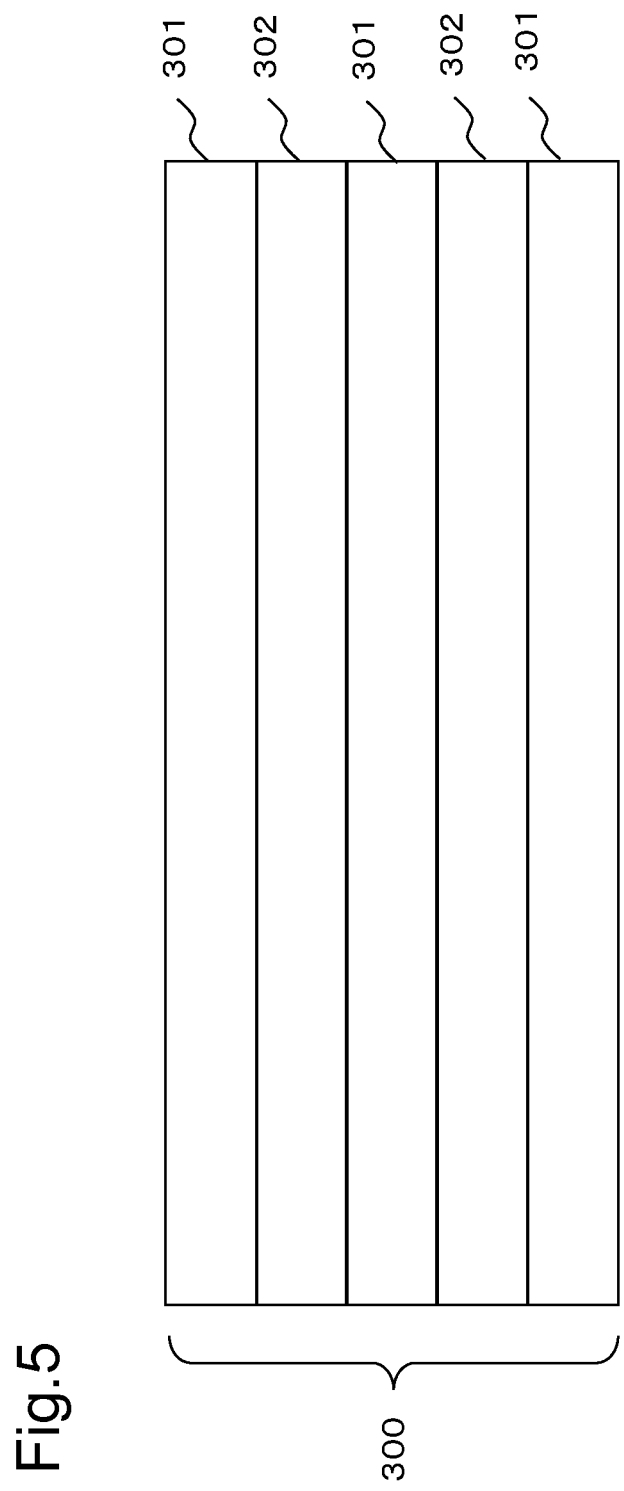
FIG. 5 is a figure illustrating an example of another thermoelectric conversion member the second example embodiment of the present invention.

The heat exchange section 11 can also use a thermoelectric conversion member with a multi-layered structure. FIG. 5 is a sectional view illustrating an example of the configuration of a thermoelectric conversion member 300 having a multilayer structure. The thermoelectric conversion member 300 is alternately provided with a layer of a first thermoelectric conversion material 301 and a layer of a second thermoelectric conversion material 302. As the first thermoelectric conversion material 301, the same material as the insulating thermoelectric conversion material 201 can be used. Further, as the second thermoelectric conversion material 302, the same material as the conductive thermoelectric conversion material 202 can be used.

The thermoelectric conversion member 300 is configured such that the surfaces on both sides become the first thermoelectric conversion material 301, and the layers of the first thermoelectric conversion material 301 and the layers of the second thermoelectric conversion material 302 are alternately stacked. The second thermoelectric conversion material 302 and the two first thermoelectric conversion materials 301 sandwiching the second thermoelectric conversion material 302 have a function as a spin Seebeck element. Therefore, the thermoelectric conversion member 300 has a configuration in which a plurality of spin Seebeck elements are stacked. FIG. 5 illustrates a configuration in which two spin Seebeck elements are stacked by three layers of first thermoelectric conversion material 301 and two layers of second thermoelectric conversion material 302. Also, the layers of the first thermoelectric conversion material 301 and the layers of the second thermoelectric conversion material 302 may be formed of materials different in composition from each other.

The first flow path 12 and the second flow path 13 are configured such that two flow paths are separated by the heat exchange section 11 using a rectangular tube through which the fluid passes. The first flow path 12 is the flow path through which the fluid from the heat source flows. The second flow path 13 is a flow path through which the fluid from heat reservoir flows. Therefore, since there is a temperature difference between the fluid flowing through the first flow path 12 and the second flow path 13, a heat flow is generated in the direction perpendicular to the plane of the heat exchange section 11.

The operation of the heat exchange device 10 of the present example embodiment will be described. In the heat exchange device 10 of the present example embodiment, the fluid flowing from the heat source flows to the first flow path 12, and the fluid flowing from the heat reservoir flows to the second flow path 13. The fluid flowing through the first flow path 12 is hotter than the fluid flowing through the second flow path 13.

When a fluid having a temperature difference flows on both sides of the heat exchange section 11, heat flow is generated in the direction of penetrating the heat exchange section 11, and a temperature gradient is generated in the direction perpendicular to the plane of the heat exchange section 11. When a temperature gradient occurs, thermoelectromotive force is generated in the heat exchange section 11 in the direction perpendicular to the direction of heat flow and magnetization. The power generated by the thermoelectromotive force is extracted outside through the circuit or terminal connected to the magnetic body and is supplied as power to other equipment.

Figure 6:
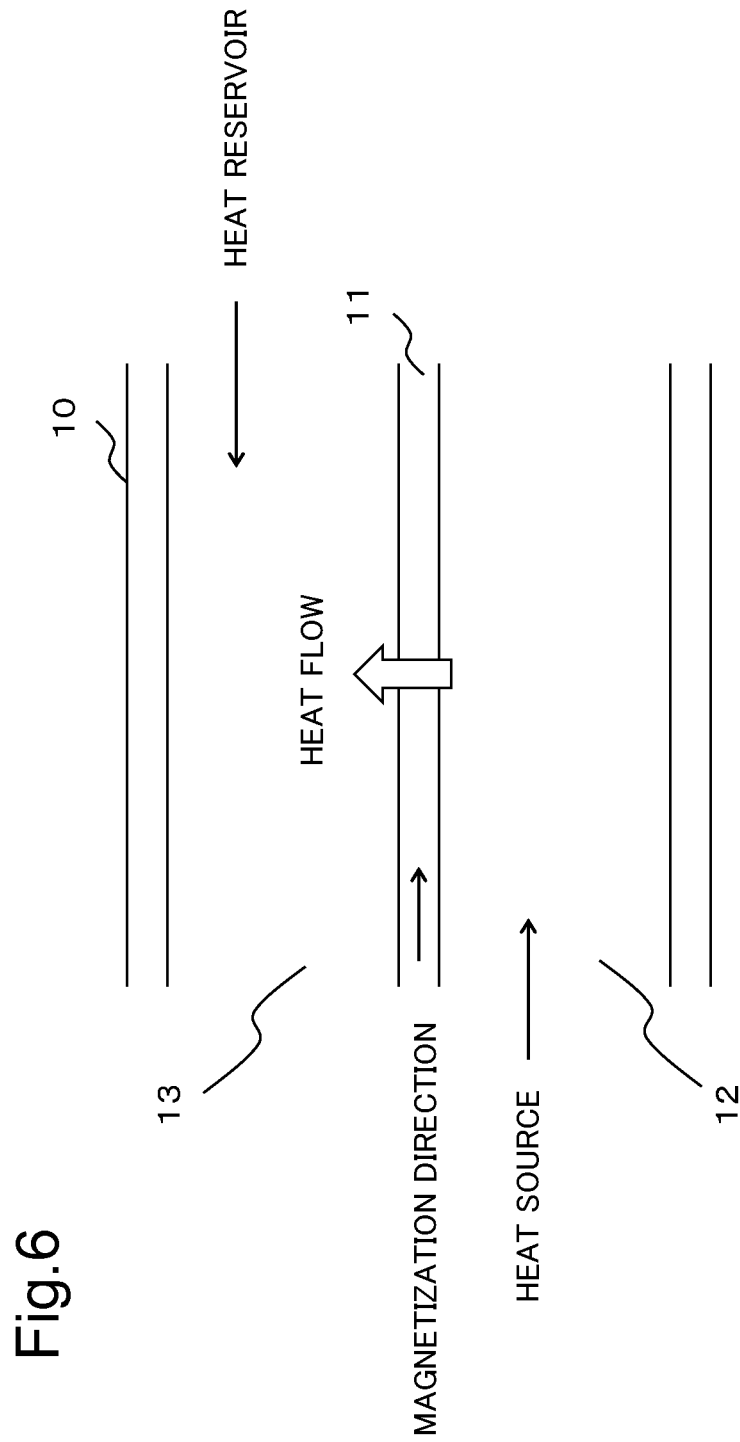
FIG. 6 is a figure schematically illustrating a heat flow in the second example embodiment of the present invention.

The heat exchange device 10 will be described in more detail. FIG. 6 is a sectional view schematically illustrating a sectional structure of the heat exchange device 10. Hereinafter, a case where the temperature of the heat source is higher than the heat reservoir will be described as an example. When the temperature of the heat source is high, the heat of the fluid from the heat source flows from the first flow path 12 through the heat exchange section 11 to the second flow path 13. In other words, a heat flow exists in the thermoelectric conversion member constituting the heat exchange section 11, and a temperature gradient in the heat flow direction occurs depending on the magnitude of the thermal conductivity of the thermoelectric conversion member.

The heat exchange section 11 has a magnetization in the plane of the constituent thermoelectric conversion member, and also has therein a material exhibiting electrical conductivity. Therefore, in the heat exchange section 11, a thermoelectromotive force is generated which is perpendicular to both the magnetization direction and the heat flow direction. It is preferable to appropriately insulate a part of the surrounding members constituting the heat exchange device 10 in such a way as not to short-circuit the thermoelectromotive force generated in the heat exchange section 11 when extracting the power.

Also, the direction of the thermoelectromotive force is parallel or antiparallel to the cross product direction of the vectors of the magnetization M and the heat flow q. When two or more thermoelectric conversion members are used, it is necessary to connect two thermoelectric conversion members in series or in parallel in such a way that the thermoelectromotive forces determined depending on the directions of the respective magnetizations do not cancel each other.

In the case of a normal heat exchange device, the member corresponding to the thermoelectric conversion member is made of a metal flat plate. For the flat plate, for example, stainless steel SUS304 is used. Where it is assumed that the thermal conductivity of a flat plate member made of SUS304 is 16.7 W/mK, the dimension is 120 mm in length and width, and the thickness is 1 mm, then, the heat transfer coefficient of the flat plate member is 16.7 kW/m$^2$K, the thermal resistance is $4.2 \times 10^{-3}$ K/W. The heat transfer coefficient is a physical property value that can be expressed in units of W/m$^2$K, and is an inverse number of the thermal resistivity that can be expressed in units of K/(W/m$^2$).

A case where a conventional thermoelectric conversion element is added to a conventional heat exchange device with a flat metal plate will be considered. For example, a thermoelectric conversion module in which pn junctions of a commercially available BiTe semiconductor having a size of 40 mm×40 mm are integrated is closely packed in a range of 120 mm×120 mm of a carbon steel flat plate. In such a configuration, assuming that the thermal resistance per thermoelectric conversion module is about 1 K/W, and calculating is performed disregarding the thermal resistance of the carbon steel flat plate and the interface thermal resistance between the thermoelectric conversion module and the carbon steel flat plate, the heat transfer coefficient deteriorates to 630 W/m$^2$K and the thermal resistance deteriorates to about 0.11 K/W.

Subsequently, the heat transfer coefficient in the heat exchange device 10 of the present example embodiment will be estimated. For the thermoelectric conversion member 100, for example, it is assumed that a Fe—Al—Ni—Co alloy also referred to as an alnico magnet is used. The thermal conductivity of the Fe—Al—Ni—Co alloy is about 15 W/mK. Where it is assumed that the shape is 120 mm in length and width and 1 mm in thickness, the heat transfer coefficient is 15 kW/m²K and the thermal resistance is about $4.6 \times 10^{-3}$ K/W.

In order to carry out heat exchange efficiently, it is preferable that the heat transfer coefficient of the thermoelectric conversion member used as the heat exchange section 11 be as large as possible. The heat transfer coefficient of the heat exchange device 10 of the present example embodiment is lower than that without power generation but much larger than that of a heat exchange device equipped with a conventional thermoelectric conversion element. Therefore, by using the heat exchange device 10 of the present example embodiment, power generation can be performed while suppressing the decrease in the heat transfer coefficient.

Next, the amount of power generation in the heat exchange device 10 of the present example embodiment will be estimated. It is supposed that the temperature of the heat source is 80 degrees, the temperature of the heat reservoir is 20 degrees, and waters of respective temperatures are introduced to a heat exchange device whose width and thickness of the flow paths are 12 cm and 0.5 cm, respectively, with a flow rate of 6.8 liters/min. The temperatures of the heat source and the heat reservoir, and the temperature in the following description are indicated by the Celsius temperature.

In the flat plate heat exchange device 10, when introducing the fluids from the heat source and the heat reservoir in such a way as to face each other as illustrated in FIG. 2, the temperature differences within the first flow path 12 and within the second flow path 13 are different at each point in the water flow direction inside the heat exchange device 10, it is assumed that each part is kept approximately constant. In addition, the heat transfer coefficient of the interface between the heat exchange section 11 and the water flow is estimated to be 3000 W/m²K.

When using SUS304 as the thermoelectric conversion material of the heat exchange section of the heat exchange device, the water temperature on the outlet side of the first flow path through which water from the heat source passes is 60 degrees, and the water temperature on the outlet side of the second flow path through which the water from the heat reservoir passes is 40 degrees. The heat flow rate passing through the thermoelectric conversion member is about 793 W. However, since SUS304 does not exhibit a significant anomalous Nernst effect, power generation does not occur.

A case where a normal thermoelectric conversion element is added to the heat exchange section of the heat exchange device will be considered. At this time, the heat transfer coefficient of the thermoelectric conversion member is greatly reduced due to the introduction of the thermoelectric conversion element. As the heat transfer coefficient decreases, the water temperature on the outlet side of the first flow path can only be cooled to about 72 degrees, and the heat flow rate passing through the thermoelectric conversion member is about 320 W, which means that it has greatly dropped to half the heat flow rate for a case without the thermoelectric conversion element.

In addition, the water temperature difference between the first flow path and the second flow path is about 52 degrees at each point, and about 36 degrees thereof is the temperature difference generated inside the thermoelectric conversion element. At this time, when power generation is performed by the Seebeck effect of the BiTe-based material, it is possible to generate power with approximately 1.5% as thermoelectric conversion efficiency and approximately 4.8 W as thermoelectric power. In this case, since the thermal resistance of the thermoelectric conversion element portion is large, a large temperature difference occurs in the thermoelectric conversion element portion, and although the amount of power generation can be acquired, the amount of heat exchange is largely deteriorated.

On the other hand, in a case where the heat exchange device 10 of the present example embodiment is used, the decrease in the thermal conductivity of the thermoelectric conversion member 100 made of Alnico magnet from SUS 304 is small, and the water temperature on the outlet side of the first flow path 12 can be cooled to about 60.1 degrees. Further, the heat flow rate passing through the thermoelectric conversion member 100 is also about 788 W, and cooling performance comparable to that of SUS 304 can be acquired. As a result, the water temperature difference between the first flow path 12 and the second flow path 13 is about 40.1 degrees at each point, and about 3.6 degrees thereof is the temperature difference inside the thermoelectric conversion element. At this time, although the thermal conductive performance index by the anomalous Nernst effect of the alnico magnet is inferior in thermoelectric conversion coefficient as compared to the BiTe based material, it is expected that a value almost equivalent is acquired as the thermoelectric power factor because the resistivity is significantly reduced. When the thermoelectric conversion efficiency and output are calculated using a non-dimensional thermoelectric conversion performance index 0.74 equivalent to that of a BiTe-based thermoelectric element, the thermoelectric conversion efficiency of the thermoelectric conversion member 100 is about 0.15 percent, and the thermoelectric output is about 1.2 W.

As described above, with the heat exchange device 10 using the thermoelectric conversion member of the present example embodiment as the heat exchange section 11, power can be generated under the condition that the cooling performance by the heat exchange is hardly impaired.

In order to make a more optimal design of the heat exchange device 10 of the present example embodiment, it is preferable to follow the rule below. It is assumed that a temperature difference between a heat source and a heat reservoir is denoted by $\Delta T$, a heat resistance of a thermoelectric conversion element portion of a structure constituting the heat exchange device 10 is denoted by $\theta_{TE}$, and a parasitic thermal resistance of a portion other than the thermoelectric conversion element in the structure constituting the heat exchange device 10 is denoted by $\theta_P$. It is assumed that the interface thermal resistance generated in the first heat transfer interface is $\theta_{IF1}$ and the interface thermal resistance generated in the second heat transfer interface is $\theta_{IF2}$. In such a case, the relation between the heat flow Q and $\Delta T$ flowing between the heat source and the heat reservoir can be expressed as $\Delta T = (\theta_{TE} + \theta_P + \theta_{IF1} + \theta_{IF2}) \cdot Q$ according to the Fourier law. The first heat transfer interface is a portion where the thermoelectric conversion material of the heat exchange section 11 is in contact with the fluid flowing through the first flow path 12. The second heat transfer interface is a portion where the thermoelectric conversion material of the heat exchange section 11 is in contact with the fluid flowing through the second flow path 13.

The thermoelectromotive force V of the thermoelectric conversion element is $V=S\cdot\Delta T\cdot\theta_{TE}/(\theta_{TE}+\theta_O)$, where the thermoelectric conversion coefficient is S, and $\theta_O=\theta_P+\theta_{IF1}+\theta_{IF2}$. The maximum extraction power $P_{max}$ can be calculated as $P_{max}=(S\cdot\Delta T\cdot\theta_{TE})^2/(4R\cdot(\theta_{TE}+\theta_O)^2)$, assuming that $P_{max}=V^2/4R$, where the internal resistance of the element is denoted as R.

Here, where it is assumed that the physical thickness of the thermoelectric conversion element is d, there is a relationship of $S^2/R \propto 1/d$, $\theta_{TE}=d$. Partially introducing these into $P_{max}$ and simplifying the equation, a relational equation $P_{max} \propto \theta_{TE}/(\theta_{TE}+\theta_O)^2$ is obtained. This relational expression has the property of becoming maximum when $\theta_{TE}=\theta_O$.

As described above, when a normal module type thermoelectric conversion element is used, this results in a condition that $\theta_{TE}$ becomes much larger than $\theta_O$, and accordingly cannot be used under a condition that $P_{max}$ becomes maximum. In addition, when a normal module type thermoelectric conversion element is used, Q becomes small due to the addition of a large $\theta_{TE}$ under the condition of a constant $\Delta T$, and the performance as a heat exchange device is also impaired.

The heat exchange device 10 of the present example embodiment is practically possible to be designed to satisfy the most preferable conditions realized by $\theta_{TE}=\theta_O$, and can also be used by being designed in such a way that $\theta_{TE}$ is smaller than $\theta_O$, regarding the performance as a heat exchange device important. Therefore, the heat exchange device 10 of the present example embodiment can be designed with high power generation efficiency while maintaining the performance as the heat exchange device.

The heat exchange device 10 of the present example embodiment performs heat exchange between the fluid from the heat source flowing through the first flow path 12 and the fluid from the heat reservoir flowing through the second flow path 13 in the heat exchange section 11 made of the thermoelectric conversion member. The heat exchange device 10 of the present example embodiment generates electricity on the basis of the temperature gradient generated in the heat exchange section 11 due to the temperature difference between the first flow path 12 and the second flow path 13.

The heat exchange device 10 of the present example embodiment can suppress the decrease in the heat transfer coefficient as compared with the case where the thermoelectric conversion element is attached to the heat exchange section 11, since the heat exchange section 11 is made of the magnetic body and the like. Therefore, the heat exchange device 10 of the present example embodiment can generate power without degrading the cooling performance by heat exchange. In addition, since the heat exchange device 10 of the present example embodiment generates a large heat flow in the thermoelectric conversion member of the heat exchange section 11, power generation can be performed efficiently. As a result, the heat exchange device 10 of the present example embodiment can generate power efficiently while maintaining the heat transfer property.

Third Example Embodiment

Figure 7:
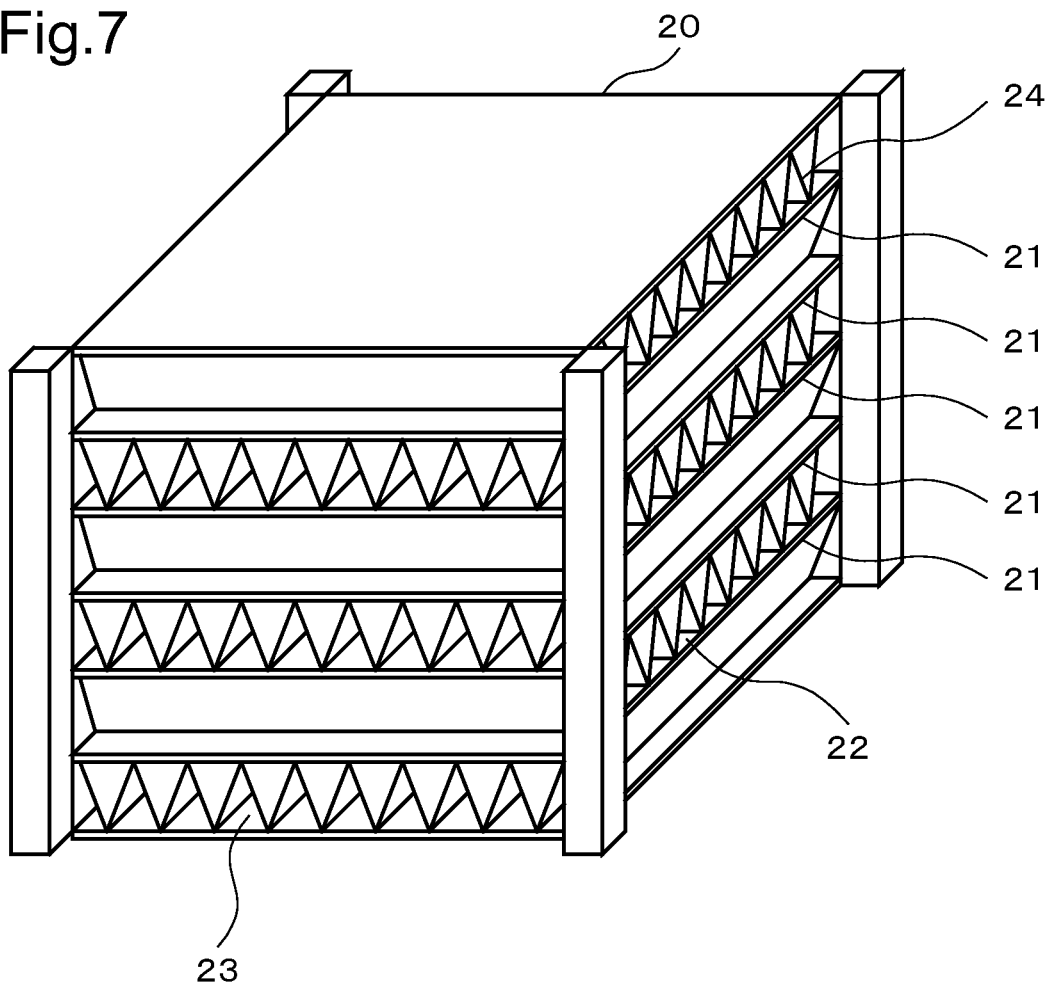
FIG. 7 is a figure illustrating overview of a configuration of a third example embodiment of the present invention.

The third example embodiment of the present invention will be described in detail with reference to the drawings. FIG. 7 is a figure illustrating overview of a configuration of a heat exchange device 20 of the present example embodiment. The heat exchange device 20 of the present example embodiment includes a plurality of heat exchange sections 21, a first flow path 22, a second flow path 23, and a fin 24. The heat exchange device 20 of the present example embodiment is characterized in that the thermal conductivity from each fluid is improved by forming the fin 24 in each flow path between the heat exchange sections 21.

For the heat exchange section 21, a thermoelectric conversion member similar to the heat exchange section 11 of the second example embodiment can be used. The direction of magnetization of the thermoelectric conversion member of the heat exchange section 21 is set according to the direction in which heat flow is generated and the direction in which power is extracted. The plurality of thermoelectric conversion members of the heat exchange section 21 may be connected in series to increase the thermoelectromotive force and internal resistance as a thermoelectric conversion element. Alternatively, a plurality of thermoelectric conversion members may be connected in parallel to integrate and extract the thermal excitation current.

The first flow path 22 and the second flow path 23 are perpendicular to each other. The first flow path 22 is a path through which the fluid sent from the heat source flows. The second flow path 23 is a path through which the fluid sent from the heat reservoir flows. The heat exchange device 20 of the present example embodiment can acquire larger heat exchange quantity and power generation quantity because the fluid from the heat source and the fluid from the heat reservoir flow in the directions perpendicular to each other.

The fins 24 are formed of a metal or the like having thermal conductivity.

In the heat exchange device 20 of the present example embodiment, the fluid flowing from the heat source flows to the first flow path 22, and the fluid flowing from the heat reservoir flows to the second flow path 23. Also, it is assumed that the fluid flowing through the first flow path 22 is hotter than the fluid flowing through the second flow path 23.

When a fluid having a temperature difference flows on both sides of the heat exchange section 21, a heat flow is generated in the direction of penetrating the heat exchange section 21, and a temperature gradient is generated in the direction perpendicular to the plane of the heat exchange section 21. In addition, since the heat of the fluid is easily transferred to the heat exchange section 21 because the fins 24 have thermal conductivity, the temperature difference between both interfaces of the heat exchange section 21 is close to a temperature difference between the first flow path 22 and the second flow path 23. Therefore, the heat exchange device 20 of the present example embodiment can further improve the efficiency of heat exchange and power generation. In addition, since the fins 24 have a rectifying effect on the fluid flowing through the first flow path 22 and the second flow path 23, the stability of heat exchange and power generation is improved.

When a temperature gradient occurs, thermoelectromotive force is generated in the heat exchange section 21 in the direction perpendicular to the direction of heat flow and magnetization. The power generated by the thermoelectromotive force is extracted outside through the circuit or terminal connected to the magnetic body and is supplied as power to other equipment.

In FIG. 7, the first flow path 22 and the second flow path 23 are formed in perpendicular directions, but may be in parallel with each other. When the directions are parallel to each other, for example, the fluid is made to flow in the opposite direction to the first flow path 22 and the second flow path 23.

The heat exchange device 20 of the present example embodiment has fins 24 having thermal conductivity in the first flow path 22 and the second flow path 23, and thereby the heat of the fluid flowing in the flow path is easily transmitted to the heat exchange section 21. As a result, the heat exchange device 20 improves heat exchange and power generation efficiency.

Fourth Example Embodiment

Figure 8:
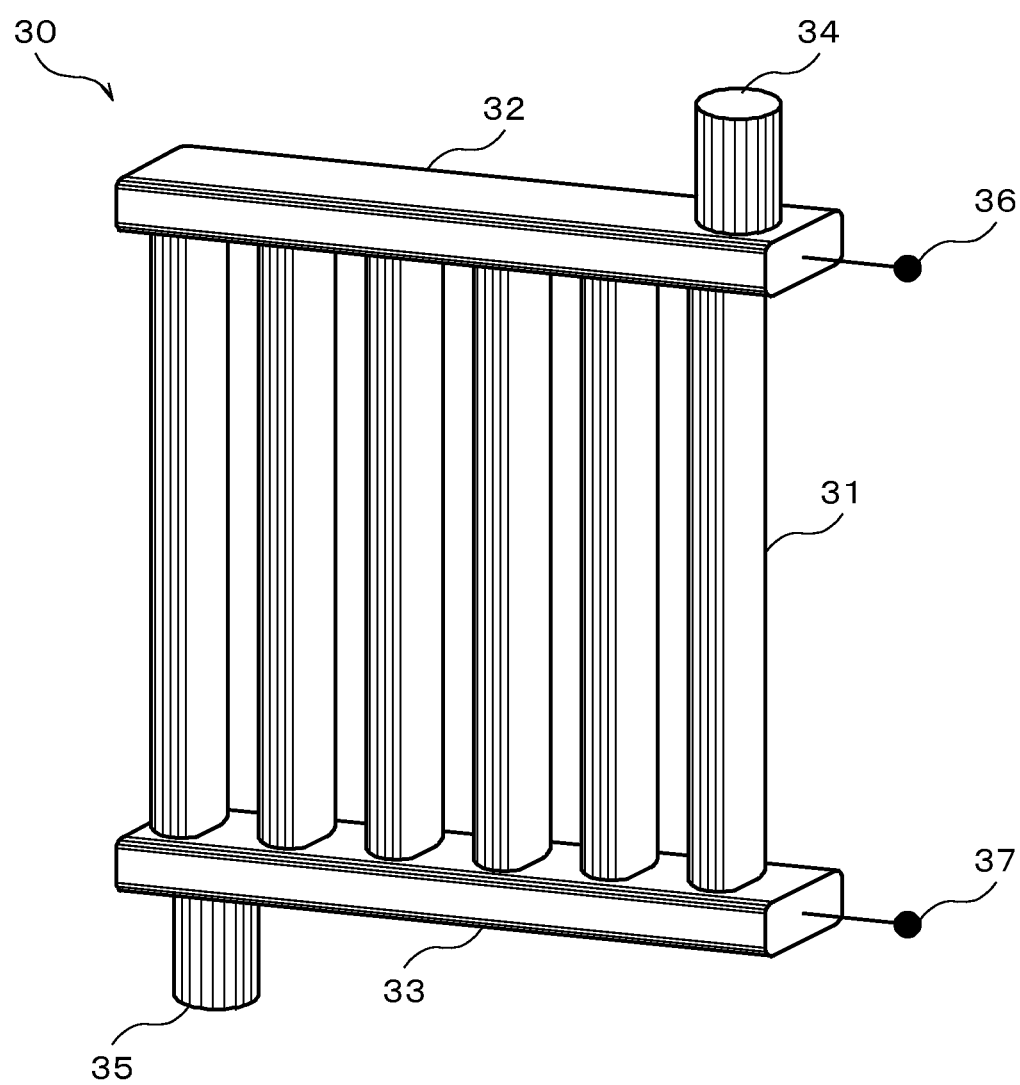
FIG. 8 is a figure illustrating overview of a configuration of a fourth example embodiment of the present invention.

The fourth example embodiment of the present invention will be described in detail with reference to the drawings. FIG. 8 is a figure illustrating overview of a configuration of a heat exchange device 30 of the present example embodiment. The heat exchange device 30 of the present example embodiment includes a thermoelectric conversion tube 31, a refrigerant dispersion and charge current collection tube 32, a refrigerant aggregation and charge current collection tube 33, a refrigerant introduction pipe 34, a refrigerant discharge pipe 35, a first terminal 36, and a second terminal 37. The heat exchange device of the second and third example embodiment has a flat plate heat exchange section, whereas the heat exchange device 30 of the present example embodiment is characterized as being of a radiator type.

The heat exchange device 30 of the present example embodiment is a radiator type heat exchange device that performs heat exchange between the refrigerant flowing in the plurality of thermoelectric conversion tubes 31 and the air outside the thermoelectric conversion tubes 31 or the like.

Figure 9A:
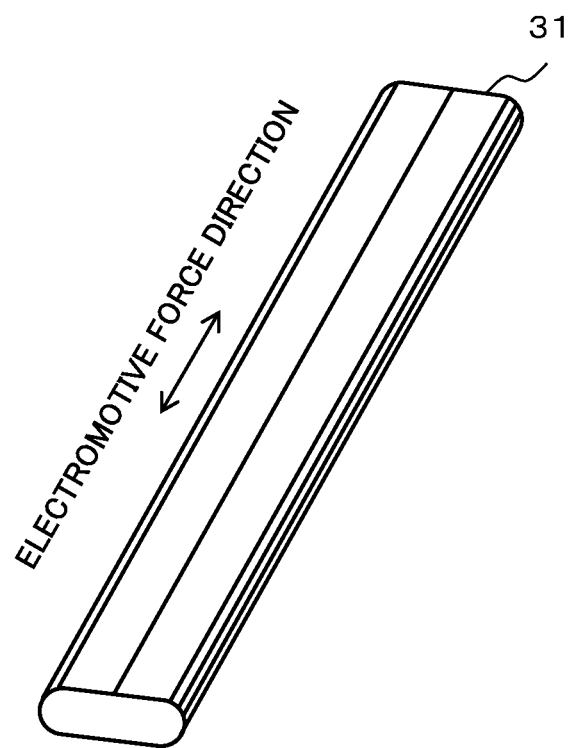
FIG. 9A is a perspective view illustrating a thermoelectric conversion tube of a fourth example embodiment of the present invention.
Figure 9B:
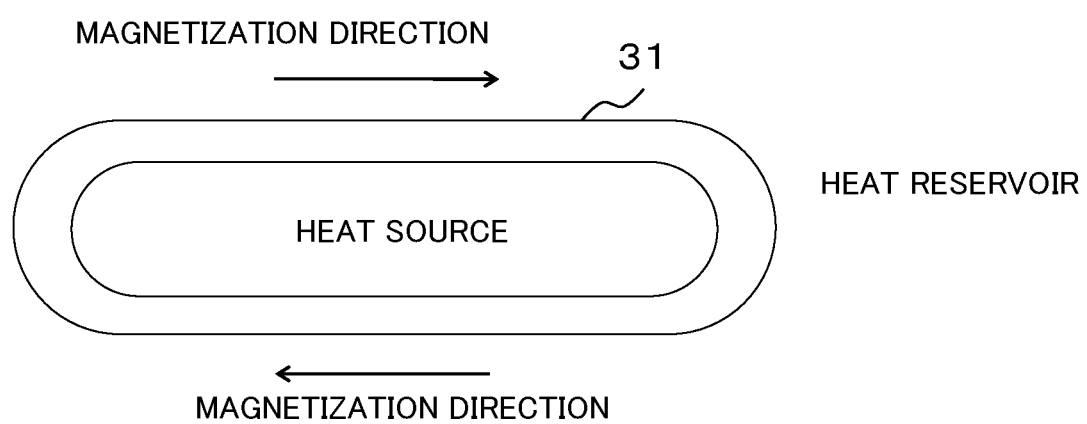
FIG. 9B is a sectional view illustrating the thermoelectric conversion tube of the fourth example embodiment of the present invention.

The configuration of the thermoelectric conversion tube 31 will be described. FIG. 9A is a perspective view of the thermoelectric conversion tube 31. FIG. 9B is a sectional view of the thermoelectric conversion tube 31. As illustrated in FIG. 9B, the thermoelectric conversion tube 31 is formed in a tubular shape in such a way as to have the flow path of the refrigerant inside. For example, the thermoelectric conversion tube 31 is attached to the heat exchange device 30 in such a way that the fluid from the heat source flows to the inside and the fluid from the heat reservoir flows to the outside.

Further, in the thermoelectric conversion tube 31, the magnetization direction is set in the circumferential direction. Therefore, the thermoelectromotive force is generated in the longitudinal direction on the basis of the temperature difference between the inside and the outside of the thermoelectric conversion tube 31. The direction of the thermoelectromotive force in the longitudinal direction is determined according to the sign of the thermoelectric conversion coefficient of the thermoelectric conversion member.

Figure 10:
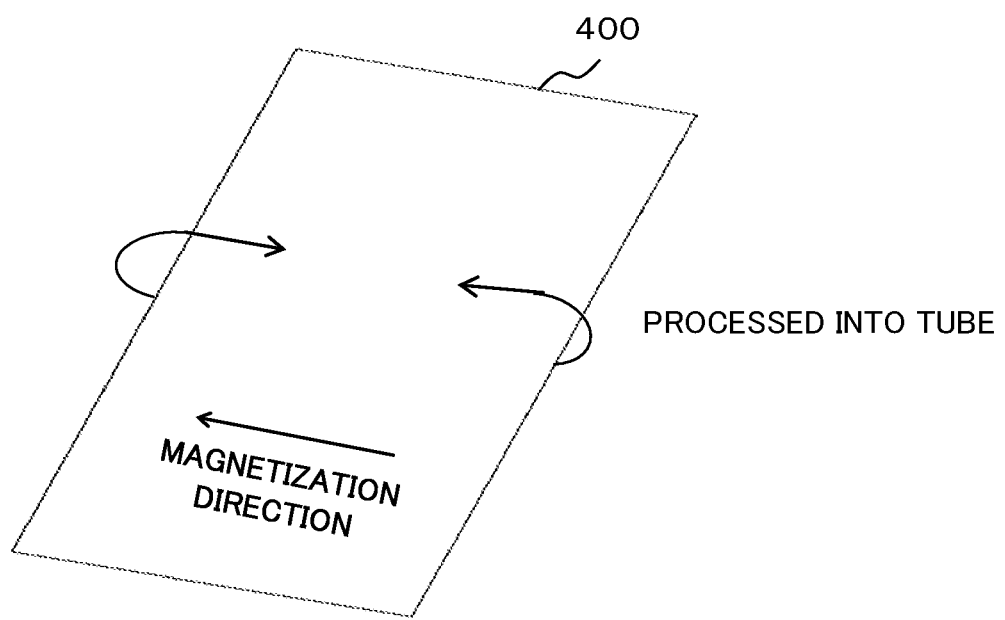
FIG. 10 is a figure illustrating a thermoelectric conversion member according to the fourth example embodiment of the present invention.

The thermoelectric conversion tube 31 is formed using a thermoelectric conversion member 400 as illustrated in FIG. 10. FIG. 10 is a figure schematically illustrating a state before processing of the thermoelectric conversion member 400 used for the thermoelectric conversion tube 31. As the thermoelectric conversion member 400, a member made of the same material as the thermoelectric conversion member 100, the thermoelectric conversion member 200 or the thermoelectric conversion member 300 can be used.

The method of producing the thermoelectric conversion tube 31 will be described by way of an example in which the same material as the thermoelectric conversion member 200 is used.

First, a permalloy plate, which is a ferromagnetic conductor with a thickness of 0.1 mm, is made as a conductive thermoelectric conversion material. Next, insulating thermoelectric conversion materials are formed on both sides of the conductive thermoelectric conversion materials. The insulating thermoelectric conversion material is formed as coating films on both sides of the conductive thermoelectric conversion material by depositing bismuth-substituted yttrium iron garnet (Bi: YIG, composition is $BiY_2Fe_5O_{12}$) by MOD (Metal Organic Decomposition) method.

The MOD solution for Bi: YIG film formation is prepared by dissolving metal raw materials consisting of appropriate molar ratio (Bi:Y:Fe=1:2:5) in the carboxylated state at a concentration of 3% in acetate. This solution is applied on the permalloy plate, dried in an oven at 150 degrees Celsius for 15 minutes, and annealed for temporary annealing at 500 degrees Celsius for 5 minutes, and annealed for main annealing in an electric furnace at a high temperature of 700 degrees Celsius under an atmospheric atmosphere for 14 hours. By this process, a polycrystalline Bi: YIG film of a film thickness of about 300 nm is formed on the permalloy plate. The flat plate thermoelectric conversion member 400 is subjected to bending processing and welding to form a tubular thermoelectric conversion tube 31.

The refrigerant dispersion and charge current collection tube 32 branches the refrigerant sent from the heat source via the refrigerant introduction pipe 34 and introduces the refrigerant s into each thermoelectric conversion tube 31. In addition, the refrigerant dispersion current collection tube 32 electrically connects the thermoelectric conversion tube 31 and the first terminal 36, and has a function as a part of a circuit for extracting electric power from the thermoelectric conversion tube 31.

The refrigerant aggregation and charge current collection tube 33 aggregates the refrigerant flowing through each thermoelectric conversion tube 31 and sends the refrigerant to the refrigerant discharge pipe 35 connected to the heat source. In addition, the refrigerant aggregation and charge current collection tube 33 electrically connects the thermoelectric conversion tube 31 and the second terminal 37, and has a function as a part of a circuit for extracting electric power from the thermoelectric conversion tube 31.

The refrigerant introduction pipe 34 is connected to the heat source, and introduces the refrigerant whose temperature has risen by the heat source into the heat exchange device 30. The refrigerant flowing from the heat source through the refrigerant introduction pipe 34 is branched at the refrigerant dispersion and charge current collection tube 32 to be introduced into each thermoelectric conversion tube 31.

The refrigerant discharge pipe 35 supplies the refrigerant cooled by the heat exchange device 30 to the heat source. The refrigerants cooled when flowing through the thermoelectric conversion tubes 31 are aggregated in the refrigerant aggregation and charge current collection tube 33 and discharged to the refrigerant discharge pipe 35.

The first terminal 36 and the second terminal 37 are formed as connection terminals for extracting electric power from the thermoelectric conversion tube 31 to the outside of the heat exchange device 30.

Further, the thermoelectric conversion tube 31 is installed in such a way that the hollow portion inside the refrigerant aggregation and charge current collection tube 33 and the refrigerant aggregation and charge current collection tube 33 and the opening portion are connected. In addition, welding processing and the like is performed in such a way that the refrigerant does not leak from the hollow portion at the connection portion.

Inside the thermoelectric conversion tube 31 of the heat exchange device 30, a refrigerant whose temperature has risen when cooling the heat source is flowing. Further, the outside of the thermoelectric conversion tube 31 is configured such that air or the like is not fed thereto and heated air does not stay there.

Since there is a temperature difference between the inside and the outside of the thermoelectric conversion tube 31, a heat flow is generated in the direction of penetrating the thermoelectric conversion tube 31 and a temperature gradient is generated in the direction perpendicular to the surface of the thermoelectric conversion tube 31.

When a temperature gradient occurs, a thermoelectromotive force is generated in the thermoelectric conversion tube 31 in the direction perpendicular to the direction of the heat flow and the magnetization. The power generated by the thermoelectromotive force is extracted to the outside through the first terminal 36 and the second terminal 37 and is supplied as power to other equipment.

Figure 11:
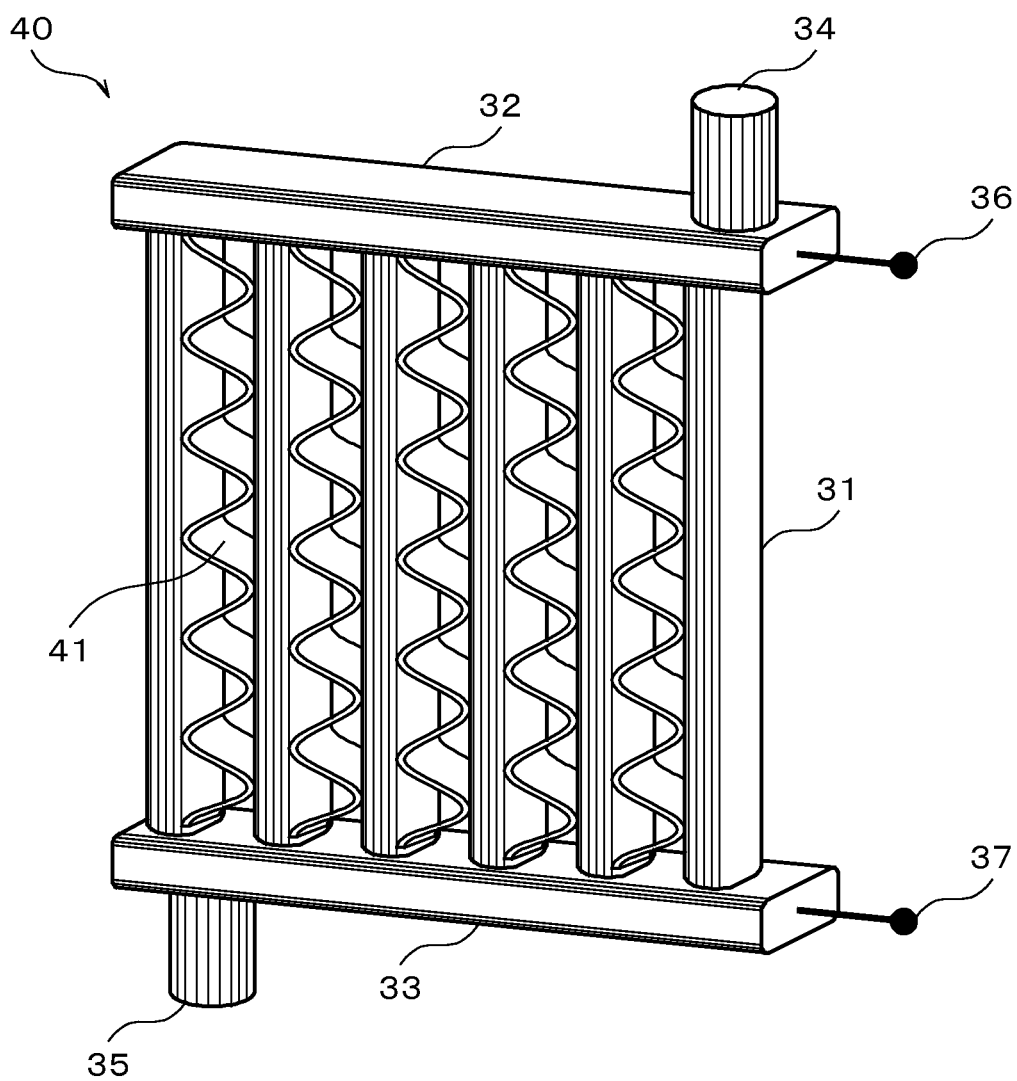
FIG. 11 is a figure illustrating an example of another configuration of the fourth example embodiment of the present invention.

In addition, fins may be placed between the thermoelectric conversion tubes 31 in the heat exchange device 30 of the present example embodiment. FIG. 11 is a figure illustrating a configuration of a heat exchange device 40 in which fins 41 are provided between the thermoelectric conversion tubes 31. The configuration other than the fins 41 of the heat exchange device 40 is the same as that of the heat exchange device 30. The fins 41 are made of, for example, a metal having thermal conductivity. By providing the fins 41, heat exchange and thermoelectric conversion performance can be further improved.

The thermoelectric conversion device of the present example embodiment can suppress the decrease in the heat transfer coefficient as compared with the case where the thermoelectric conversion element is attached to the thermoelectric conversion tube 31 because the thermoelectric conversion tube 31 is made of the magnetic body and the like. In addition, since the flow of gas or the like flowing outside the thermoelectric conversion tube 31 is not disturbed, the decrease in heat exchange performance can be suppressed. Therefore, the thermoelectric conversion device of the present example embodiment can generate electricity without degrading the cooling performance by heat exchange. Further, the thermoelectric conversion device of the present example embodiment can generate power efficiently because a large heat flow is generated in the thermoelectric conversion member of the thermoelectric conversion tube 31. As a result, the thermoelectric conversion device of the present example embodiment can generate power efficiently while maintaining the heat transfer property even with a radiator type configuration.

Fifth Example Embodiment

Figure 12A:
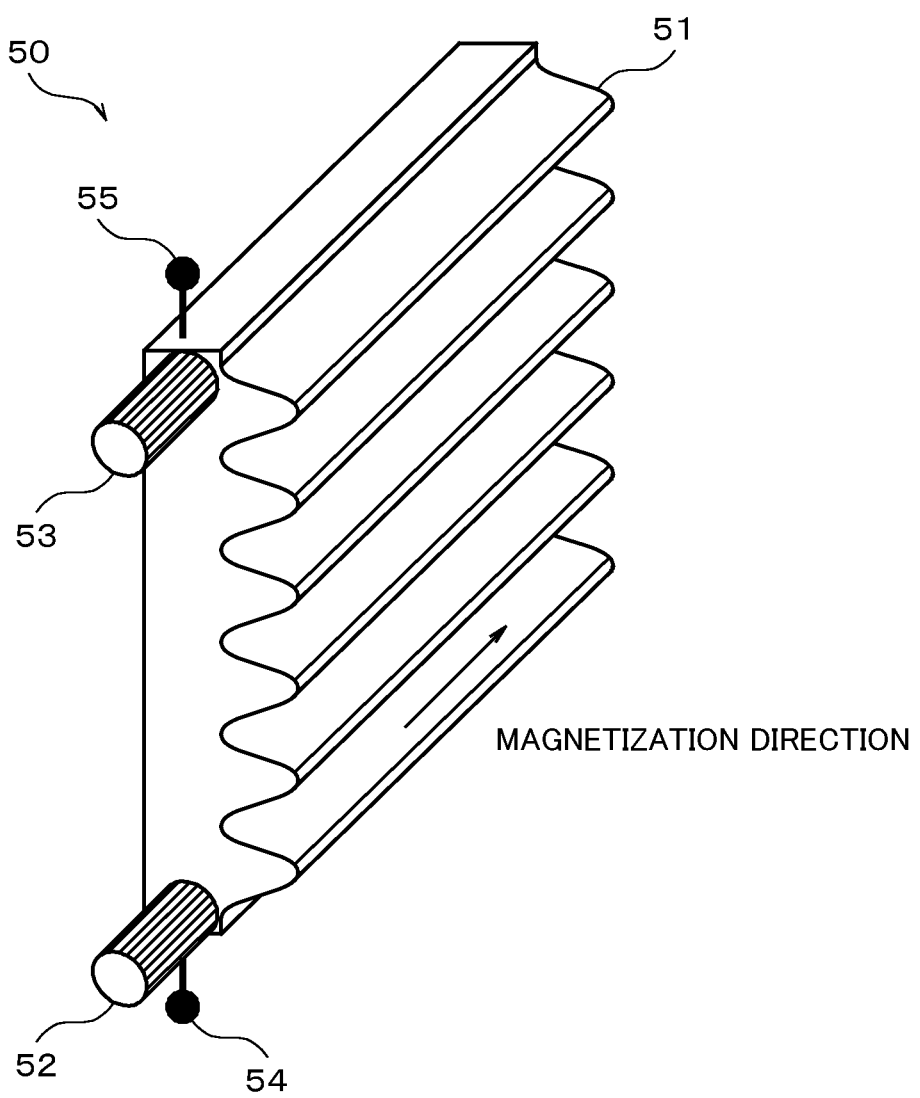
FIG. 12A is a figure illustrating overview of a configuration of a fifth example embodiment of the present invention.
Figure 12B:
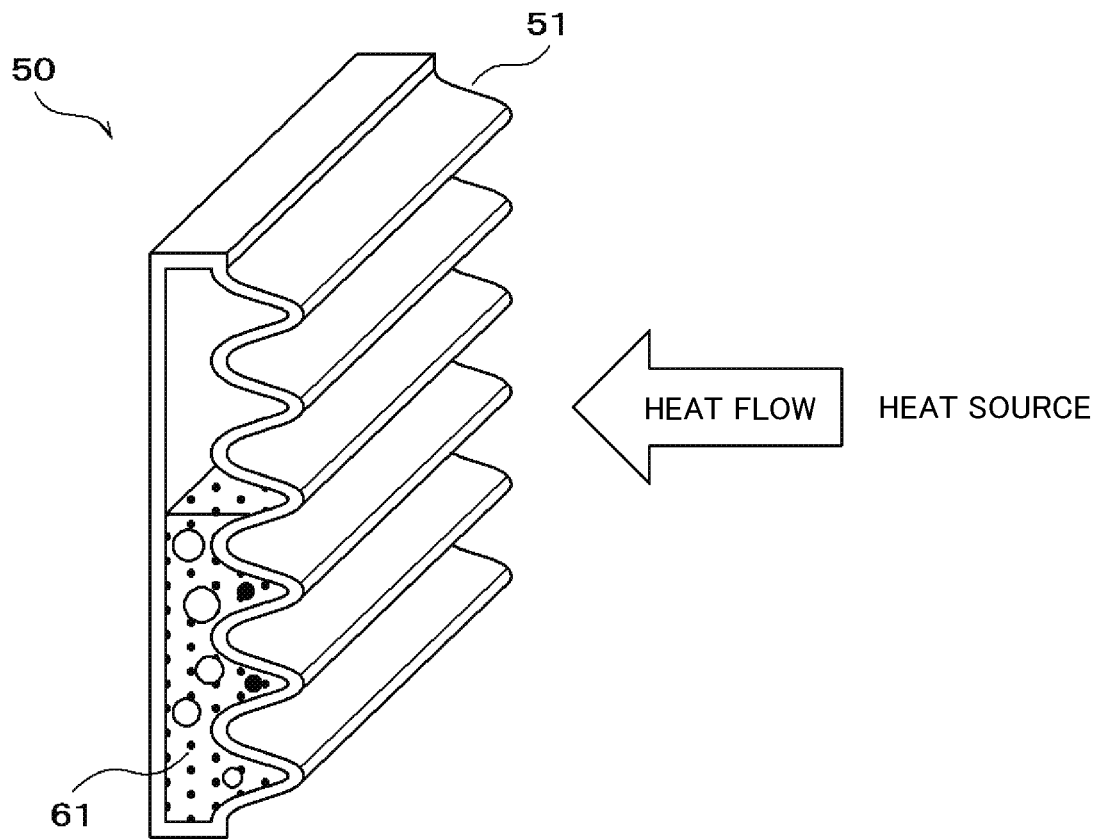
FIG. 12B is a sectional view illustrating overview of a configuration of the fifth example embodiment of the present invention.

The fifth example embodiment of the present invention will be described in detail with reference to the drawings. FIG. 12A is a perspective view illustrating overview of a configuration of a heat exchange device 50 of the present example embodiment. FIG. 12B is a figure schematically illustrating a sectional structure of the heat exchange device 50 of the present example embodiment.

The heat exchange device 50 includes a gas-liquid heat exchange section 51, a refrigerant introduction pipe 52, a refrigerant discharge pipe 53, a first terminal 54, and a second terminal 55. The heat exchange device 50 of the present example embodiment includes the gas-liquid heat exchange section 51 having a refrigerant sealed therein, and is characterized by performing sensible heat absorption and latent heat absorption of the refrigerant to cool the fluid sent from the heat source or the heat source.

Figure 13:
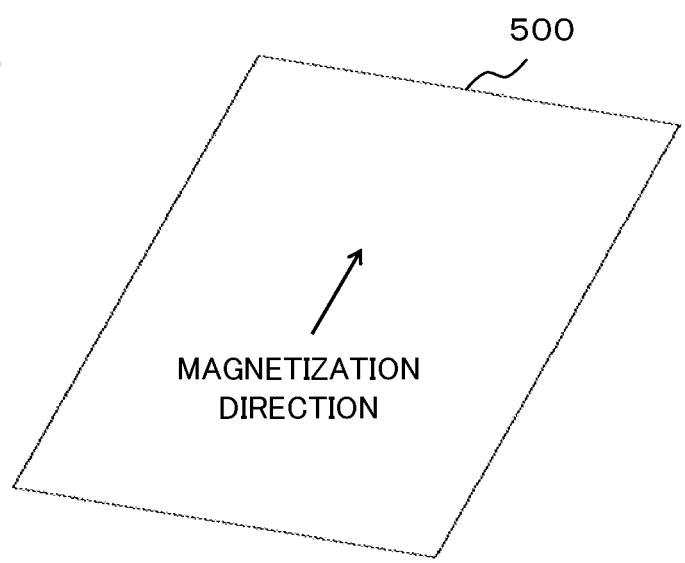
FIG. 13 is a figure illustrating a thermoelectric conversion member according to the fifth example embodiment of the present invention.

The gas-liquid heat exchange section 51 is processed in such a way that the thermoelectric conversion member is bent to have a fin-like surface. The gas-liquid heat exchange section 51 is formed by processing the thermoelectric conversion member 500 as illustrated in FIG. 13. FIG. 13 is a figure schematically illustrating the unprocessed state of the thermoelectric conversion member 500 used as the gas-liquid heat exchange section 51 of the present example embodiment.

As the thermoelectric conversion member 500, the same members as the second example embodiment of the thermoelectric conversion member 100, the thermoelectric conversion member 200, or the thermoelectric conversion member 300 can be used.

The formation method of the gas-liquid heat exchange section 51 will be described by way of an example in which the thermoelectric conversion member 300 is used. At first, five $Fe_{30}Co_{70}$ alloy plates which is a ferromagnetic conductor having a thickness of 0.1 mm as first thermoelectric conversion material 301 and five $Mn_3Ir$ alloy plates of antiferromagnetic phase having a thickness of 0.1 mm as second thermoelectric conversion material 302 are alternately stacked to make a plywood having a thickness of about 1 mm. Next, the plywood is rolled under high temperature and inert gas until a thickness of about 0.1 mm is acquired to make a flat plate thermoelectric conversion member 500.

The thermoelectric conversion materials used for the thermoelectric conversion member 500 are all materials that exhibit a thermoelectromotive force due to the anomalous Nernst effect as a magnetic conductor. Therefore, the spin accumulation due to heat flow occurs in the interface between the two materials, the spin Seebeck effect appears, and the thermoelectromotive force is generated by the inverse spin Hall effect in the thermoelectric conversion material. The flat plate thermoelectric conversion member 500 is subjected to bending and welding to form a gas-liquid heat exchange section 51 having a sectional structure as illustrated in FIG. 12B.

The gas-liquid heat exchange section 51 has a closed space inside, and has a function of storing the liquid refrigerant 60 to a certain level. A heat source exists outside the heat exchange device 50 at a separated position or directly connected position, and the heat flow from the heat source flows from the outside to the inside of the gas-liquid heat exchange section 51. As a result, the temperature of the refrigerant 60 inside the gas-liquid heat exchange section 51 rises.

At this time, by appropriately combining the boiling point of the refrigerant 60 and the internal pressure, efficient heat removal can be performed with not only the sensible heat absorption of the refrigerant but also the latent heat absorption of the refrigerant, in an operation state of a typical heat source.

For example, when it is intended to remove heat from a heat source at room temperature plus about several dozen degrees, a refrigerant having a boiling point in the target temperature range is used. As such a refrigerant, for example, a refrigerant on the basis of a fluorocarbon compound can be used.

The refrigerant introduction pipe 52 introduces a liquid refrigerant into the heat exchange device 50.

The refrigerant discharge pipe 53 discharges the gaseous refrigerant from the inside of the heat exchange device 50. The refrigerant discharged from the refrigerant discharge pipe 53 is cooled at the external heat reservoir and returned to a liquid, and then supplied from the refrigerant introduction pipe 52 to the inside of the heat exchange device 50.

The first terminal 54 and the second terminal 55 are terminals for extracting the power generated on the basis of the electromotive force generated in the thermoelectric conversion member of the gas-liquid heat exchange section 51 to the outside.

The operation of the heat exchange device 50 of the present example embodiment will be described. In the heat exchange device 50 of the present example embodiment, a heat flow flows from the heat source into the gas-liquid heat exchange section 51 by the hot air or the like. The heat flow flowing into the gas-liquid heat exchange section 51 causes the refrigerant to boil or vaporize, and the heat is absorbed by sensible heat absorption and latent heat absorption of the refrigerant.

The vaporized refrigerant is discharged from the refrigerant discharge pipe 53 to the outside of the gas-liquid heat exchange section 51, and is liquefied by cooling. The liquefied refrigerant is supplied from the refrigerant inlet pipe 52 to the inside of the gas-liquid heat exchange section 51.

Further, when the heat flow penetrates through the thermoelectric conversion member of the gas-liquid heat exchange section 51, electric power is generated by the thermoelectromotive force. The power generated in the gas-liquid heat exchange section 51 is extracted through the first terminal 54 and the second terminal 55 and is supplied as power to other equipment.

The heat exchange device 50 of the present example embodiment can perform highly efficient heat removal using sensible heat absorption and latent heat absorption of the refrigerant. In addition, since the heat exchange device 50 of the present example embodiment can maintain a stable temperature difference between the inside and the outside of the gas-liquid heat exchange section 51, power generation can be stably performed. The heat exchange device 50 of the present example embodiment can generate power while efficiently performing cooling and maintaining the heat transfer property.

Sixth Example Embodiment

The sixth example embodiment of the present invention will be described in detail with reference to the drawings. FIG. 14 illustrates overview of a configuration of a control system of the present example embodiment.

The heat exchange system of the present example embodiment includes a heat exchange device 71, a power control unit 72, a control unit 73, and a power supply 74. In addition, a temperature sensor 75 and a heat flow sensor 76 are attached to the heat exchange device 71. Further, the power control unit 72 is connected to a device 80 to which power is supplied.

The heat exchange device 71 can use the same heat exchange device as the second to fifth example embodiments.

The power control unit 72 has a function of control of the heat exchange device 71 and controlling supply of power to the device 80. The power control unit 72 performs maximum power point tracking control that enables efficient extraction of generated power on the basis of the analysis results by the control unit 73 for the current, voltage, temperature data and heat flow data of the heat exchange device 71. Further, the power control unit 72 performs control to boost or reduce the power supplied to the device 80 in accordance with the voltage required for the operation of the device 80.

The power control unit 72 measures the current and voltage of the power generated in the heat exchange device 71. Further, the temperature data and the heat flow data are acquired from the temperature sensor 75 and the heat flow sensor 76 attached to the heat exchange device 71. The power control unit 72 sends the acquired data to the control unit 73.

The power control unit 72 combines the power from the power supply 74 and the power generated by the heat exchange device 71 to supply the device 80 with the power necessary for operation. In addition, when the temperature of the heat exchange device 71 rises to a temperature requiring cooling, the power control unit 72 supplies cooling power to the heat exchange device 71 on the basis of the control of the control unit 73.

The control unit 73 analyzes the current, voltage, temperature data and heat flow data of the heat exchange device 71 acquired via the power control unit 72, and controls the supply of power to the device 80 on the basis of the analysis result. The control unit 73 also controls the power control unit 72 to supply the power supplied from the power supply 74 to the heat exchange device 71 for cooling when the temperature of the heat exchange device 71 is higher than a reference.

By supplying power to the heat exchange device 71, the cooling efficiency can be enhanced by increasing the heat exchange from the heat source to the heat reservoir by the spin-Peltier effect or the Ettingshausen effect that generates a heat flow by the current flowing through the thermoelectric conversion element. It is predicted that the capacity index of heat flow generation by the Spin-Peltier effect and the Ettingshausen effect can ideally realize a value close to one. Under ideal conditions, when 50 W of electric power is supplied, 50 W of heat can be exhausted.

For example, the control unit 73 performs control to generate electric power on the basis of the heat removal performance of the heat exchange device 71 when the heat generation of the heat source is small, and supply power for cooling to the heat exchange device 71 when the heat generation of the heat source is large.

The control unit 73 gives priority to, for example, the power input from the heat exchange device 71 and performs control for use with power supply of the device 80. By supplying power from the power supply 74 to the device 80 when the power from the heat exchange device 71 is insufficient or priority is given to cooling, the power consumption from the power supply 74 can be suppressed and the power can be stably supplied to the device 80.

Also, the control unit 73 may perform control by predicting the operation of the heat source on the basis of the data of each sensor. For example, when it is predicted that the heat discharge performance of the heat exchange device 71 is exceeded, the control unit 73 may perform control to start cooling.

Alternatively, the heat exchange device 71 may be divided into a plurality of modules in such a way that power generation and cooling can be exclusively performed independently for each module. With such a configuration, the power supply from the heat exchange device 71 and the cooling operation of the heat exchange device 71 can be more appropriately controlled. In addition, each module may be controlled to perform neither power generation nor cooling. In addition, even in the configuration provided with a plurality of heat exchange devices 71, similar control can be performed for each heat exchange device 71.

The heat exchange system of the present example embodiment operates with priority given to either power extraction or cooling when the heat exchange device 71 is in operation. Moreover, the heat exchange system of the present example embodiment can supply stable power efficiently by supplying power to the device 80 by supplying power from the power supply and the power extracted from the heat exchange device 71. Therefore, the heat exchange system of the present example embodiment can acquire power using exhaust heat while maintaining stable cooling performance.

The whole or part of the example embodiments disclosed above can be described as, but not limited to, the following supplementary notes.

(Supplementary Note 1)

A heat exchange device comprising:

a heat exchange section including a first heat transfer interface in contact with a heat source and a second heat transfer interface in contact with a heat reservoir having a temperature different from the heat source; and a magnetic body being sandwiched between the first heat transfer interface and the second heat transfer interface of the heat exchange section and having a magnetization component in a direction intersecting a heat flux generated between the first heat transfer interface and the second heat transfer interface.

(Supplementary Note 2)

The heat exchange device according Supplementary note 1, wherein the magnetic body is an aggregation body of a magnetic insulating body and a magnetic conductor.

(Supplementary Note 3)

The heat exchange device according Supplementary note 1, wherein the magnetic body is an aggregation body of at least two or more types of magnetic body conductors.

(Supplementary Note 4)

The heat exchange device according to Supplementary note 2 or 3, wherein the aggregation body of the magnetic body forms a stack structure.

(Supplementary Note 5)

The heat exchange device according to any one of Supplementary notes 1 to 4, wherein the heat exchange section forms a flow path of at least one of the heat source and the heat reservoir.

(Supplementary Note 6)

The heat exchange device according Supplementary note 5, wherein the heat exchange section is formed by a pipe of the magnetic body having the magnetization component in a circumferential direction, and forms the flow path inside the pipe.

(Supplementary Note 7) The heat exchange device according to any one of Supplementary notes 1 to 5, wherein the heat exchange device forms a reservoir of at least one of the heat source and the heat reservoir.

(Supplementary Note 8)

The heat exchange device according Supplementary note 7, wherein the heat exchange section has a folded structure.

(Supplementary Note 9)

The heat exchange device according to any one of Supplementary notes 1 to 4, further comprising:

a plurality of heat exchange section, wherein each of the heat exchange sections is provided in such a way that at least the first heat transfer interfaces face each other or the second heat transfer interfaces face each other.

(Supplementary Note 10)

The heat exchange device according Supplementary note 9, further comprising:

a thermal conduction unit between of the first heat transfer interface of the heat exchange section and the second heat transfer interface of the adjacent heat exchange section.

(Supplementary Note 11)

The heat exchange device according to any one of Supplementary notes 1 to 10, further comprising:

a connection unit electrically connecting the magnetic body and an external circuit, wherein the connection unit outputs power generated in the magnetic body to the external circuit, and sends, based on power input from the external circuit, the power to the magnetic body.

(Supplementary Note 12)

A heat exchange system comprising:

the heat exchange device according to any one of Supplementary notes 1 to 11; and a control unit controlling power supplied to a device, wherein the control unit supplies power to the device, based on power acquired from thermoelectromotive force generated in the magnetic body of the heat exchange device.

(Supplementary Note 13)

The heat exchange system according to Supplementary note 12, wherein the control unit controls power supplied to the device, based on power acquired from the heat exchange device and power input from a power supply.

(Supplementary Note 14)

The heat exchange system according to Supplementary note 12 or 13, further comprising:

a temperature measurement means measuring the heat exchange section and a temperature of the heat exchange device; and a heat flow measurement means measuring a heat flow flowing into the heat exchange section, wherein the control unit controls the heat exchange device, based on a temperature measured by the temperature measurement unit and a heat flow measured by the heat flow measurement unit.

(Supplementary Note 15)

The heat exchange system according to Supplementary note 14, wherein the control unit performs control in such a way that current flows to the magnetic body, based on power input from a power supply when a temperature measured by the temperature measurement unit is equal to or more than a reference.

(Supplementary Note 16)

The heat exchange system according to any one of Supplementary notes 12 to 15, further comprising: a plurality of heat exchange devices, wherein the control unit controls, for each of the heat exchange devices, supply of power from the heat exchange device.

(Supplementary Note 17)

A heat exchange method comprising:

sandwiching, between a first heat transfer interface in contact with a heat source and a second heat transfer interface in contact with a heat reservoir having a temperature different from the heat source, a magnetic body having a magnetization component in a direction intersecting a heat flux generated between the first heat transfer interface and the second heat transfer interface;

causing the first heat transfer interface to be in contact with the heat source or a first fluid sent from the heat source;

causing the second heat transfer interface to be in contact with the heat reservoir or a second fluid sent from the heat reservoir; and outputting power generated by thermoelectromotive force in the magnetic body to outside.

(Supplementary Note 18)

The heat exchange method according to Supplementary note 17, further comprising:

causing liquid in a reservoir of the heat reservoir being formed at a position in contact with the second heat transfer interface to be vaporized by heat of the heat source in contact with the first heat transfer interface or a fluid flowing from the heat source, and cooling the heat source or a fluid flowing from the heat source.

(Supplementary Note 19)

The heat exchange method according to Supplementary note 17, further comprising:

causing a fluid of any one of the first fluid and the second fluid to flow inside a pipe of the magnetic body having the magnetization component in a circumferential direction, and causing another fluid of the first fluid and the second fluid to flow outside the pipe.

(Supplementary Note 20)

The heat exchange method according to Supplementary note 17, further comprising:

arranging a plurality of the magnetic bodies each sandwiched between the first heat transfer interface and the second heat transfer interface in such a way that the first heat transfer interfaces face each other and the second heat transfer interfaces face each other, introducing the first fluid sent from the heat source to a region sandwiched between the first heat transfer interfaces, and introducing the second fluid sent from the heat reservoir to a region sandwiched between the second heat transfer interfaces.

(Supplementary Note 21)

The heat exchange method according to any one of Supplementary notes 17 to 20, further comprising:

supplying power to a device, based on power acquired from the magnetic body and power input from a power supply.

(Supplementary Note 22)

The heat exchange method according to any one of Supplementary notes 17 to 21, further comprising:

measuring a temperature around the magnetic body, measuring a heat flow flowing into the magnetic body, and controlling a thermoelectric conversion operation in the magnetic body, based on the temperature and the heat flow being measured.

(Supplementary Note 23)

The heat exchange method according to any one of Supplementary notes 17 to 22, further comprising:

performing control in such a way that current flows to the magnetic body, based on power input from a power supply when the measured temperature is equal to or more than a reference.

(Supplementary Note 24)

The heat exchange method according to any one of Supplementary notes 17 to 23, further comprising:

making division into a plurality of modules having the magnetic body, and controlling supply of power from the modules for each of the modules.

While the invention has been particularly shown and described with reference to exemplary example embodiments thereof, the invention is not limited to these example embodiments. It will be understood by those of ordinary skill in the art that various changes in form and details may be made therein without departing from the spirit and scope of the present invention as defined by the claims.

This application is based upon and claims the benefit of priority from Japanese patent application No. 2017-54446, filed on Mar. 21, 2017, the disclosure of which is incorporated herein in its entirety by reference.

REFERENCE SIGNS LIST 1 heat exchange section
2 magnetic body
3 first heat transfer interface
4 second heat transfer interface
10 heat exchange device
11 heat exchange section
12 first flow path
13 second flow path
20 heat exchange device
21 heat exchange section
22 first flow path
23 second flow path
24 fin
30 heat exchange device
31 thermoelectric conversion tube
32 refrigerant dispersion current collection tube
33 refrigerant aggregation current collection tube
34 refrigerant introduction pipe
35 refrigerant discharge pipe
36 first terminal
37 second terminal
40 heat exchange device
41 fin
50 heat exchange device
51 gas-liquid heat exchange section
52 refrigerant introduction pipe
53 refrigerant discharge pipe
54 first terminal
55 second terminal
60 refrigerant
71 heat exchange device
72 power control unit
73 control unit
74 power supply
75 temperature sensor
76 heat flow sensor
80 device
100 thermoelectric conversion member
200 thermoelectric conversion member
201 insulating thermoelectric conversion material
202 conductive thermoelectric conversion material
300 thermoelectric conversion member
301 first thermoelectric conversion material
302 second thermoelectric conversion material
400 thermoelectric conversion member
500 thermoelectric conversion member

The invention claimed is:

1. A heat exchange device comprising:
a heat exchanger including a first heat transfer interface in contact with a heat source and a second heat transfer interface in contact with a heat reservoir having a temperature different from the heat source; and
a magnetic body being sandwiched between the first heat transfer interface and the second heat transfer interface of the heat exchanger and having a magnetization component in a direction intersecting a heat flux generated between the first heat transfer interface and the second heat transfer interface, wherein
the heat exchanger forms a flow path of at least one of the heat source and the heat reservoir, and the heat exchanger is formed by a pipe of the magnetic body having the magnetization component in a circumferential direction, and forms the flow path inside the pipe.

2. The heat exchange device according to claim 1, wherein the magnetic body is a multi-layered structure of a magnetic insulating body and a magnetic conductor.

3. The heat exchange device according to claim 2, wherein the aggregation body of the magnetic body forms a stack structure.

4. The heat exchange device according to claim 1, wherein the magnetic body is an aggregation body of at least two types of magnetic body conductors.

5. The heat exchange device according to claim 1, wherein the heat exchange device forms a reservoir of at least one of the heat source and the heat reservoir.

6. The heat exchange device according to claim 5, wherein the heat exchanger has a folded structure.

7. The heat exchange device according to claim 1, further comprising:
a connector electrically connecting the magnetic body and an external circuit, wherein
the connector outputs power generated in the magnetic body to the external circuit, and sends, based on power input from the external circuit, the power to the magnetic body.

8. A heat exchange device comprising:
a plurality of heat exchangers configured to include a first heat transfer interface in contact with a heat source and a second heat transfer interface in contact with a heat reservoir having a temperature different from the heat source; and
a magnetic body being sandwiched between the first heat transfer interface and the second heat transfer interface of each of the plurality of the heat exchangers and having a magnetization component in a direction intersecting a heat flux generated between the first heat transfer interface and the second heat transfer interface,
wherein each of the heat exchangers is provided in such a way that at least the first heat transfer interfaces face each other or the second heat transfer interfaces face each other.

9. The heat exchange device according to claim 8, further comprising:
a thermal conductor between of the first heat transfer interface of the heat exchanger and the second heat transfer interface of the adjacent heat exchanger.

10. A heat exchange system comprising:
a heat exchange device configured to include
a heat exchanger including a first heat transfer interface in contact with a heat source and a second heat transfer interface in contact with a heat reservoir having a temperature different from the heat source; and
a magnetic body being sandwiched between the first heat transfer interface and the second heat transfer interface of the heat exchanger and having a magnetization component in a direction intersecting a heat flux generated between the first heat transfer interface and the second heat transfer interface; and
a controller which controls power supplied to a device, wherein
the controller supplies power to the device, based on power acquired from thermoelectromotive force generated in the magnetic body of the heat exchange device.

11. The heat exchange system according to claim 10, further comprising:

a temperature sensor which measures the heat exchanger and a temperature of the heat exchange device; and
a heat flow sensor which measures a heat flow flowing into the heat exchanger, wherein
the controller controls the heat exchange device, based on a temperature measured by the temperature sensor and a heat flow measured by the heat flow sensor.

12. The heat exchange system according to claim 11, wherein the controller performs control in such a way that current flows to the magnetic body, based on power input from a power supply when a temperature measured by the temperature sensor is equal to or more than a reference.

13. A heat exchange method comprising:
sandwiching, between a first heat transfer interface in contact with a heat source and a second heat transfer interface in contact with a heat reservoir having a temperature different from the heat source, a magnetic body having a magnetization component in a direction intersecting a heat flux generated between the first heat transfer interface and the second heat transfer interface;
causing liquid in a reservoir of the heat reservoir being formed at a position in contact with the second heat transfer interface to be vaporized by heat of the heat source in contact with the first heat transfer interface or a fluid flowing from the heat source, and cooling the heat source or a fluid flowing from the heat source;
causing the first heat transfer interface to be in contact with the heat source or a first fluid sent from the heat source;
causing the second heat transfer interface to be in contact with the heat reservoir or a second fluid sent from the heat reservoir; and
outputting power generated by thermoelectromotive force in the magnetic body to outside.

14. The heat exchange method according to claim 13, further comprising:
causing a fluid of any one of the first fluid and the second fluid to flow inside a pipe of the magnetic body having the magnetization component in a circumferential direction, and causing another fluid of the first fluid and the second fluid to flow outside the pipe.

15. The heat exchange method according to claim 13, further comprising:
arranging a plurality of the magnetic bodies each sandwiched between the first heat transfer interface and the second heat transfer interface in such a way that the first heat transfer interfaces face each other and the second heat transfer interfaces face each other,
introducing the first fluid sent from the heat source to a region sandwiched between the first heat transfer interfaces, and
introducing the second fluid sent from the heat reservoir to a region sandwiched between the second heat transfer interfaces.

16. The heat exchange method according to claim 13, further comprising:
measuring a temperature around the magnetic body,
measuring a heat flow flowing into the magnetic body, and
controlling a thermoelectric conversion operation in the magnetic body, based on the temperature and the heat flow being measured.

17. The heat exchange method according to claim 13, further comprising:
performing control in such a way that current flows to the magnetic body, based on power input from a power supply when the measured temperature is equal to or more than a reference.

* * * * *